(12) United States Patent
Wen

(10) Patent No.: US 9,766,519 B2
(45) Date of Patent: Sep. 19, 2017

(54) ARRAY SUBSTRATE, METHOD OF FABRICATING THE SAME AND LIQUID CRYSTAL DISPLAY PANEL

(71) Applicants: Xiamen Tianma Micro-Electronics Co., Ltd., Xiamen (CN); Tianma Micro-Electronics Co., Ltd., Shenzhen (CN)

(72) Inventor: Liang Wen, Xiamen (CN)

(73) Assignees: XIAMEN TIANMA MICRO-ELECTRONICS CO., LTD., Xiamen (CN); TIANMA MICRO-ELECTRONICS CO., LTD., Shenzhen (CN)

( * ) Notice: Subject to any disclaimer, the term of this patent is extended or adjusted under 35 U.S.C. 154(b) by 0 days.

(21) Appl. No.: 14/542,512

(22) Filed: Nov. 14, 2014

(65) Prior Publication Data

US 2015/0378223 A1 Dec. 31, 2015

(30) Foreign Application Priority Data

Jun. 30, 2014 (CN) .......................... 2014 1 0309051

(51) Int. Cl.
| | |
|---|---|
| *H01L 27/02* | (2006.01) |
| *G02F 1/1362* | (2006.01) |
| *H01L 27/12* | (2006.01) |
| *H01L 29/786* | (2006.01) |
| *H01L 29/66* | (2006.01) |
| *H01L 21/311* | (2006.01) |

(Continued)

(52) U.S. Cl.
CPC .. *G02F 1/136204* (2013.01); *G02F 1/136227* (2013.01); *H01L 21/31144* (2013.01); *H01L 21/32134* (2013.01); *H01L 21/76804* (2013.01); *H01L 21/76805* (2013.01); *H01L 27/0288* (2013.01); *H01L 27/124* (2013.01); *H01L 27/1222* (2013.01); *H01L 27/1274* (2013.01); *H01L 29/66757* (2013.01); *H01L 29/78675* (2013.01); *H01L 21/02532* (2013.01); *H01L 21/02686* (2013.01)

(58) Field of Classification Search
None
See application file for complete search history.

(56) References Cited

U.S. PATENT DOCUMENTS

2008/0290421 A1* 11/2008 Wang ................ H01L 21/28518
257/384
2010/0032681 A1* 2/2010 Kuriyagawa ..... H01L 29/78621
257/72

FOREIGN PATENT DOCUMENTS

| CN | 102760017 A | 10/2012 |
| CN | 102945106 A | 2/2013 |

* cited by examiner

*Primary Examiner* — Long Pham
(74) *Attorney, Agent, or Firm* — Alston & Bird LLP

(57) ABSTRACT

An array substrate is disclosed. The array substrate includes a substrate, a first film layer on a side surface of the substrate, an insulation layer on the side surface of the substrate, an electrostatic charge dispersion layer on the side surface of the substrate, and a second film layer arranged on the side surface of the substrate. The first film layer, the insulation layer, the electrostatic charge dispersion layer, and the second film layer are sequentially arranged on the substrate. In addition, the insulation layer and the electrostatic charge dispersion layer include via holes, the second film layer is electrically connected with the first film layer through the via holes, and the electrostatic charge dispersion layer is in a same profile as the second film layer.

14 Claims, 23 Drawing Sheets

(51) Int. Cl.
*H01L 21/768* (2006.01)
*H01L 21/3213* (2006.01)
*H01L 21/02* (2006.01)

ARRAY SUBSTRATE, METHOD OF FABRICATING THE SAME AND LIQUID CRYSTAL DISPLAY PANEL

CROSS-REFERENCES TO RELATED APPLICATIONS

This application claims the benefit of priority to Chinese Patent Application No. 201410309051.2, filed with the Chinese Patent Office on Jun. 30, 2014 and entitled "ARRAY SUBSTRATE, METHOD OF FABRICATING THE SAME AND LIQUID CRYSTAL DISPLAY PANEL", the content of which is incorporated herein by reference in its entirety.

TECHNICAL FIELD

The present invention relates to the field of display technologies and particularly to an array substrate and a method of fabricating the array substrate.

BACKGROUND

Along with the development of manufacturing technologies of displays, Thin Film Transistor-Liquid Crystal Displays (TFT-LCDs) have become predominant in the market due to their small volume, low power consumption, high resolution and other advantages in the market of flat panel displays.

The TFT-LCDs generally include the following two categories dependent upon operating modes of their liquid crystals: one of the categories relates to the liquid crystals operating in a vertical electric field, where a liquid crystal layer is driven by the electric field in the direction substantially perpendicular to the surface of a substrate, and light incident on the liquid crystal layer is modulated for display, and this display mode generally includes a Twisted Nematic (TN) mode, a Multi-domain Vertical Alignment (MVA) mode, etc.; and the other category relates to the liquid crystals operating in a horizontal electric field, where the liquid crystal layer is driven by the electric field in the direction substantially horizontal to the surface of the substrate, and light incident on the liquid crystal layer is modulated for display, and this display mode generally includes an In-Plane Switching (IPS) type, a Fringe Field Switching (FFS) type, etc.

An array substrate is one of main components of a TFT-LCD. the array substrate is prepared in the prior art in a process flow generally including the formation of TFT devices, where the TFT devices are fabricated in a process varying with a different semiconductor material. When the semiconductor material is made of amorphous silicon, TFTs in a bottom-gate structure is typically adopted, and forming the TFT devices includes: forming a gate, a gate insulation layer, a semiconductor layer and a source-drain metal layer in order on the substrate. When the semiconductor material is made of a low-temperature poly-silicon material, TFTs in a top-gate structure are typically adopted, and forming the TFT device includes: forming a semiconductor layer, a gate insulation layer, a gate metal layer, an interlayer dielectric layer and a source-drain metal layer in order on the substrate. A process after the TFT devices are formed slightly varies with a different operating mode of liquid crystals. In the vertical electric field pattern, an interlayer insulation layer and a transparent electrode layer are typically further formed in order on the substrate after the TFT devices are formed. In the horizontal electric field pattern, a passivation layer, a first transparent electrode layer, an interlayer insulation layer and a second transparent electrode layer are typically further formed in order on the substrate after the TFT devices are formed.

In either the vertical electric field pattern or the horizontal electric field pattern, it is typically necessary to form via holes on the insulation layer in a pixel area or an edge area to connect electrically conductive layers on both sides of the insulation layer. The forming the via holes generally includes: forming a photoresist layer on the insulation layer on which the via holes are to be formed; patterning the photoresist layer so that the photoresist layer is provided with a pattern of the via holes to be formed; etching the insulation layer so that the insulation layer with the via holes is formed; and removing the remaining photoresist layer. In the process flow of the array substrate, a lot of charges are accumulated on the substrate due to frictional electrification, contact and separation electrification, inductive electrification and other reasons, and the electrically conductive layer below the insulation layer is exposed in the course of forming the via holes on the insulation layer until forming the conductive layer above the insulation layer; and discharging of electrostatic charges may tend to occur in the processes of stripping away the photoresist, cleaning, etc., so that the TFT devices may be struck or damaged by the electrostatic charges to consequentially come with electrical drifting, so that pixel electrodes may be charged more slowly or rapidly than normal to thereby be lower or higher than a normal pixel potential, thus resulting in a Mura region.

SUMMARY

One inventive aspect is an array substrate. The array substrate includes a substrate, a first film layer on a side surface of the substrate, an insulation layer on the side surface of the substrate, an electrostatic charge dispersion layer on the side surface of the substrate, and a second film layer arranged on the side surface of the substrate. The first film layer, the insulation layer, the electrostatic charge dispersion layer, and the second film layer are sequentially arranged on the substrate. In addition, the insulation layer and the electrostatic charge dispersion layer include via holes, the second film layer is electrically connected with the first film layer through the via holes, and the electrostatic charge dispersion layer is in a same profile as the second film layer.

Another inventive aspect is a liquid crystal display panel, including an opposite substrate, an array substrate, and a liquid crystal layer interposed between the array substrate and the opposite substrate. The array substrate includes a substrate, a first film layer on a side surface of the substrate, an insulation layer on the side surface of the substrate, an electrostatic charge dispersion layer on the side surface of the substrate, and a second film layer arranged on the side surface of the substrate. The first film layer, the insulation layer, the electrostatic charge dispersion layer, and the second film layer are sequentially arranged on the substrate. In addition, the insulation layer and the electrostatic charge dispersion layer include via holes, the second film layer is electrically connected with the first film layer through the via holes, and the electrostatic charge dispersion layer is in a same profile as the second film layer.

Another inventive aspect is a method of fabricating an array substrate. The method includes preparing a substrate, forming a first film layer on one side surface of the substrate, and forming an insulation layer on the first film layer. The method also includes forming an electrostatic charge dispersion layer on the insulation layer, forming via holes in the insulation layer and in the electrostatic charge dispersion layer so that the electrostatic charge dispersion layer overlaps the insulation layer outside the via holes, and forming a second film layer on the electrostatic charge dispersion layer. The second film layer is electrically connected with the first film layer through the via holes. The method also includes patterning the second film layer and the electrostatic charge dispersion layer so that the electrostatic charge dispersion layer is in a same profile as the second film layer.

DETAILED DESCRIPTION OF THE EMBODIMENTS

In order to make the objects, features and advantages of the invention more apparent and easily understood, the invention will be further described below with reference to the drawings and embodiments thereof.

It shall be noted that particular details are set forth in the following description to facilitate sufficient understanding of the invention. However the invention can be embodied in a number of implementations other than those described herein, and those skilled in the art can generalize similarly without departing from the essence of the invention. Accordingly the invention will not be limited to the particular embodiments disclosed below.

Figure 1:
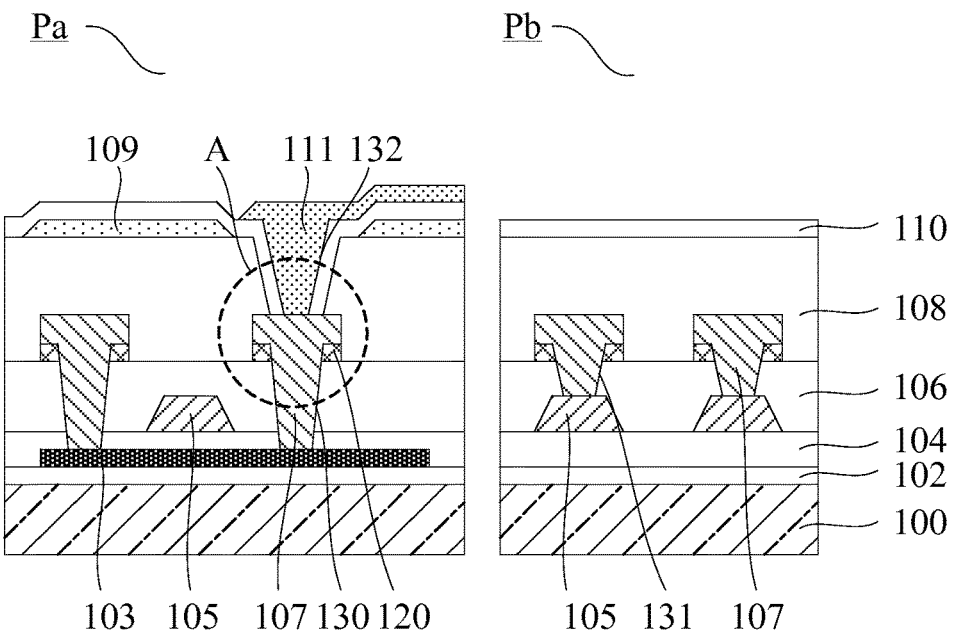
FIG. 1 illustrates a schematic structural diagram of an array substrate according to an embodiment of the present invention in a sectional view.

FIG. 1 illustrates a schematic structural diagram of an array substrate according to an embodiment of the invention in a sectional view, where Pa represents a display area of the array substrate, and Pb represents a peripheral area of the array substrate.

Referring to FIG. 1, the array substrate includes: a substrate 100, and a first film layer, an insulation layer, an electrostatic charge dispersion layer 120 and a second film layer arranged in order on one side surface of the substrate 100, where the insulation layer and the electrostatic charge dispersion layer are provided with via holes 130, and the second film layer is electrically connected with the first film layer through the via holes 130; and the electrostatic charge dispersion layer 120 is in a same profile as the second film layer such that the second film layer overlap the electrostatic charge dispersion layer 120. In the present embodiment, the first film layer is a semiconductor layer 103, the insulation layer is a multilayer insulation layer composed of a gate insulation layer 104 and an interlayer dielectric layer 106, and the second film layer is a source-drain metal layer 107. Stated otherwise, in the present embodiment, the semiconductor layer 103, the gate insulation layer 104, a gate metal layer 105, the interlayer dielectric layer 106, the electrostatic charge dispersion layer 120 and the source-drain metal layer 107 are formed in order on the substrate 100; and the multilayer insulation layer composed of the gate insulation layer 104 and the interlayer dielectric layer 106, and the electrostatic charge dispersion layer 120 are provided thereon with the via holes 130, and the source-drain metal layer 107 is electrically connected with the semiconductor layer 103 through the via holes 130; and the electrostatic charge dispersion layer 120 is in a same profile as the source-drain metal layer 107.

More particularly, further referring to FIG. 1, in the present embodiment, the substrate 100 can be a base substrate based upon an inorganic material, such as a glass substrate, a quartz substrate, etc., or can be a base substrate made of an organic material.

A buffer layer 102 is typically formed on the substrate 100 to thereby prevent metal ions in the substrate 100, e.g., aluminum ions, barium ions, sodium ions, etc., from being diffused into an active area of the semiconductor layer 103 in a thermal process and lower the thermal conductivity. The buffer layer 102 is typically made of silicon nitride, silicon oxide or a mixture of both. Typically a light shielding layer (not illustrated) can be further formed at a location on the substrate corresponding to the semiconductor active area to thereby prevent an influence of backlight on the semiconductor active area, where the light shielding layer is typically made of a very thin metal material.

The semiconductor layer 103 is formed on the buffer layer 102, where the semiconductor material can be amorphous silicon, an oxide semiconductor or low-temperature poly-silicon, where the low-temperature poly-silicon is adopted as the semiconductor material in the present embodiment due to its high electron mobility. The semiconductor layer 103 further includes an active area and a source-drain connection area (not illustrated).

The gate insulation layer 104 is formed on the semiconductor layer 103, where the gate insulation layer 104 is typically made of silicon nitride, silicon oxide or a mixture of both.

The gate metal layer 105 is formed on the gate insulation layer 104. The gate metal layer 105 can constitute the gates of TFT devices in the display area Pa, and the gate metal layer 105 can constitute a peripheral circuit, e.g., a gate driving circuit in the peripheral area Pb, where the gate metal layer is typically made of a material of molybdenum, a molybdenum alloy, aluminum, an aluminum alloy, etc.

The interlayer dielectric layer 106 is formed on the gate metal layer 105, where the interlayer dielectric layer can be a monolayer made of silicon oxide, silicon nitride or a mixture of both or a multilayer of stacked silicon oxide and silicon nitride.

The electrostatic charge dispersion layer 120 is formed on the interlayer dielectric layer 106, where the material of the electrostatic charge dispersion layer 120 is at least one of molybdenum, titanium, iron, zinc, aluminum and magnesium or combination thereof, such materials have a high electrical conductive, and standard electrode potential of these materials are typically lower than an molybdenum alloy which is typically used as a gate material, so that after the electrostatic charge dispersion layer 120 is formed until the source-drain metal layer 107 is formed, these materials can achieve a function of electrostatic protection on the gate metal layer 105 and the semiconductor layer 103 below the electrostatic charge dispersion layer 120, and can achieve a function of cathode protection to prevent the gate metal layer 105 from being electrochemically corrosion. Moreover the film thickness d of the electrostatic charge dispersion layer 120 ranges from 5 nm to 500 nm, so that better electrostatic protection can be achieved while the cost is controlled and a lower resistivity is maintained.

The source-drain metal layer 107 is formed on the electrostatic charge dispersion layer 120. The source-drain metal layer 107 is electrically connected with a source-drain contact area of the semiconductor layer 103 through the via holes 130 of the electrostatic charge dispersion layer 120, the interlayer dielectric layer 106 and the gate insulation layer 104 in the display area Pa; and the source-drain metal layer 107 is electrically connected with the gate metal layer 105 through the via holes 131 of the electrostatic charge dispersion layer 120 and the interlayer dielectric layer 106 in the peripheral area Pb. Moreover the electrostatic charge dispersion layer 120 is in the same profile as the source-drain metal layer 107, and the profiles of the electrostatic charge dispersion layer 120 and the source-drain metal layer 107 can be formed in the same process step in the preparation process without any addition process step.

A passivation layer 108 is formed on the source-drain metal layer 107, where the passivation layer 108 can be a monolayer of an organic passivation layer or an inorganic passivation layer or can be a multilayer of a silicon nitride film or a silicon oxide film combined with an organic passivation layer film or an inorganic passivation layer film. In the present embodiment, a first transparent electrode layer 109, an interlayer insulation layer 110 and a second transparent electrode layer 111 are further formed on the passivation layer 108 in the display area Pa, and the second transparent electrode layer 111 is electronically connected with the source-drain metal layer 107 through the via holes 132 and can be as a pixel electrode, and a plurality of slits (not illustrated) can be further formed in the second transparent electrode layer 111. In a practical implementation, the first transparent electrode layer can alternatively be electrically connected with the source-drain metal layer and be as a pixel electrode. In a practical implementation, alternatively only the first transparent electrode can be formed on the passivation layer 108 and electrically connected with the source-drain metal layer and the second transparent electrode can be formed on an opposite substrate opposite to the array substrate.

Figure 2:
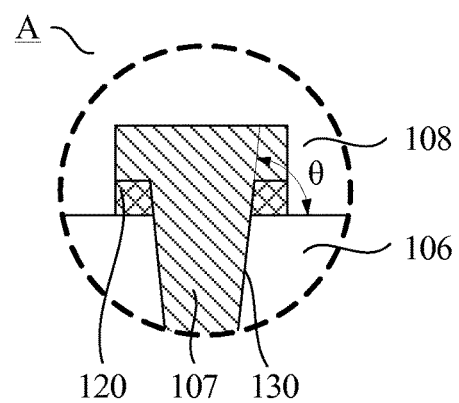
FIG. 2 illustrates a schematic enlarged diagram of the region A in FIG. 1.

More particularly, FIG. 2 illustrates a schematic enlarged diagram of the region A in FIG. 1. Referring to FIG. 1 and FIG. 2, the electrostatic charge dispersion layer 120, the source-drain metal layer 107 and the passivation layer 108 are formed in order on the interlayer dielectric layer 106, and the electrostatic charge dispersion layer 120 and the interlayer dielectric layer 106 are provided with the via holes 130. The electrostatic charge dispersion layer 120 is inclined at the via holes 130 at an angle θ ranging from 0° to 90° and preferably 30° to 60°, and due to the inclination angle of the electrostatic charge dispersion layer 120, electrostatic charges accumulated on the substrate can be more easily discharged on the electrostatic charge dispersion layer 120 by surface leakage, etc., to thereby achieve a better electrostatic protection effect.

The array substrate according to the present embodiment includes the electrostatic charge dispersion layer so that accumulation of electrostatic charges on the array substrate in the preparation process of the substrate can be lowered, and a damage of the electrostatic charges to the semiconductor layer can be lowered in the display area to thereby improve the stability and the uniformity of the TFT devices, avoid the TFT devices from being struck or damaged by the electrostatic charges to consequentially come with electrical drifting, and eliminate various electrostatic Muras. In the peripheral area, a poor display effect due to layer erosion or the like arising from discharging of the electrostatic charges can be improved to thereby improve a product yield. Moreover the electrostatic charge dispersion layer directly contacts with the source-drain metal layer so that the resistivity of the source-drain metal layer can be lowered to thereby improve delay attenuation of a display signal over a wire consisted of the source-drain metal layer thus enhancing a display quality.

FIG. 3 illustrates schematic structural diagrams of a flow of fabricating the array substrate in FIG. 1 in sectional views.

Referring to FIG. 3, the step is performed: preparing a substrate and forming a first film layer on one side surface of the substrate.

Figure 3A:
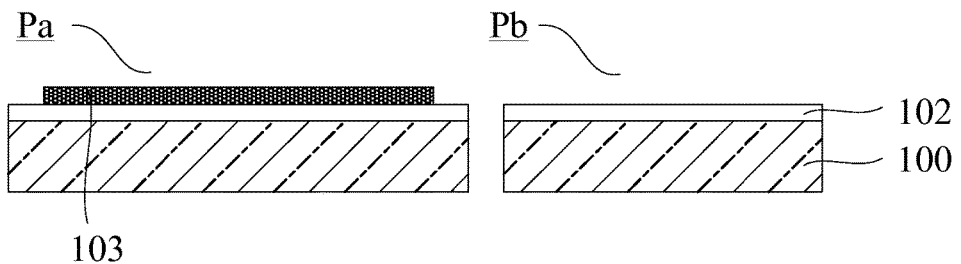
FIGS. 3a-3i illustrate schematic structural diagrams of a flow of fabricating the array substrate in FIG. 1 in sectional views.

Particularly, referring to FIG. 3a, this step includes: forming a buffer layer 102 on the substrate 100, and forming the semiconductor layer 103 on the buffer layer 102 and patterning the semiconductor layer, where the semiconductor layer 103 is the first film layer as referred to in the present embodiment.

In the present embodiment, the buffer layer 102 is deposited by plasma enhanced chemical vapor deposition. In a practical implementation, a light shielding layer (not illustrated) can be further formed at a location on the substrate 100 corresponding to the semiconductor active area before the buffer layer 102 is formed, where the light shielding layer is typically made of a very thin metal material and prepared by physical deposition, e.g., sputtering.

The semiconductor layer 103 is formed on the buffer layer 102 and patterned. It shall be noted that the buffer layer 102 is not necessary to the invention, and in a practical implementation, the semiconductor layer 103 may alternatively be formed directly on the substrate 100. The semiconductor material can be amorphous silicon, an oxide semiconductor or poly-silicon, where the poly-silicon is adopted as the semiconductor material in the present embodiment due to its high electron mobility.

More particularly forming the poly-silicon semiconductor layer in the present embodiment includes the following steps: depositing an amorphous silicon material on one side surface of the substrate 100 and crystallizing the amorphous silicon material to convert the amorphous silicon material into a poly-silicon material. Where the amorphous silicon material is deposited by plasma enhanced chemical vapor deposition, the deposition thickness being 450 Å. The deposited amorphous silicon material is heated at the thermal temperature of 500° C. to be dehydrogenized. The dehydrogenized amorphous silicon material can be crystallized in an excimer laser crystallization process, a solid phase crystallization process or a rapid thermal annealing process. Due to a very short fusing and crystallization process of a thin film of amorphous silicon in the excimer laser crystallization process and a very low thermal impact on the substrate, an inexpensive glass substrate, which is no-resistant to high temperature, can be used to thereby lower a fabrication cost. Thus the amorphous silicon material can be crystallized in the excimer laser crystallization process in the present embodiment.

After the amorphous silicon material is crystallized as described above, the poly-silicon material is patterned to form the semiconductor layer 103 in the display area Pa, and to form the semiconductor layer in an area of the peripheral area Pb where the poly-silicon material needs to be reserved, e.g., the transistor area of a gate driving circuit (not illustrated), while all the poly-silicon material in the other area needs to be etched away. A particular patterning process includes: coating a photoresist layer on the poly-silicon material layer and drying the photoresist layer; exposing and developing the photoresist layer, particularly by irradiating the photoresist layer with UV-rays using a mask in a predetermined pattern and removing the photoresist pattern of the irradiated part using alkaline developing solution after exposure, to thereby form the photoresist pattern with the predetermined pattern; etching poly-silicon material, particularly by dry etching so that a volatile reactant is generated after ion radicals in plasmas are adhered to the surface of the poly-silicon material; and stripping the photoresist, that is, the remaining photoresist is removed using stripping liquid. So far the semiconductor layer 103 is formed. In a practical operation process, the substrate needs to be cleaned and dried to remove impurities on the surface of the substrate before and after each of the steps of coating the photoresist, exposing and developing, etching, stripping, etc.

After the semiconductor layer 103 is formed, channel doping is further performed so that the semiconductor layer 103 is formed with the source area and the source-drain connection area (not illustrated).

Further referring to FIG. 3, the step is performed: forming an insulation layer on the first film layer, wherein the insulation layer covers the first film layer and the substrate.

Figure 3B:
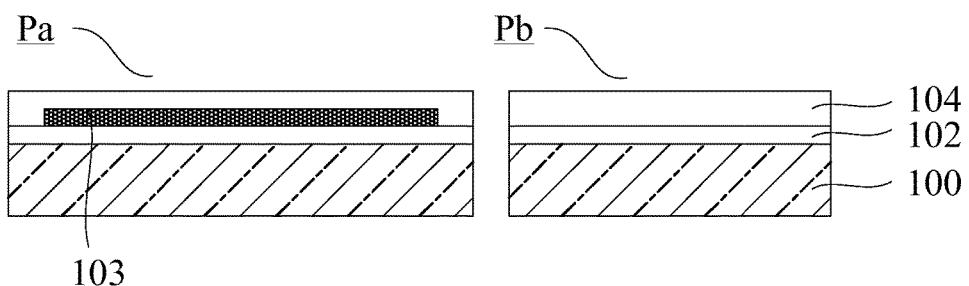
Figure 3C:
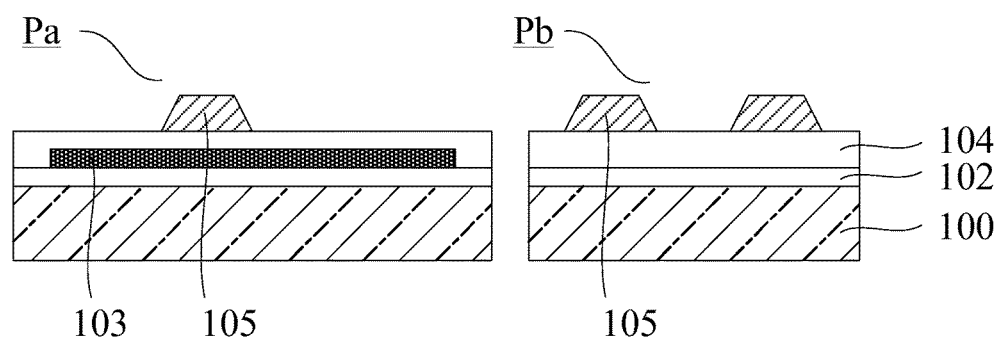
Figure 3D:
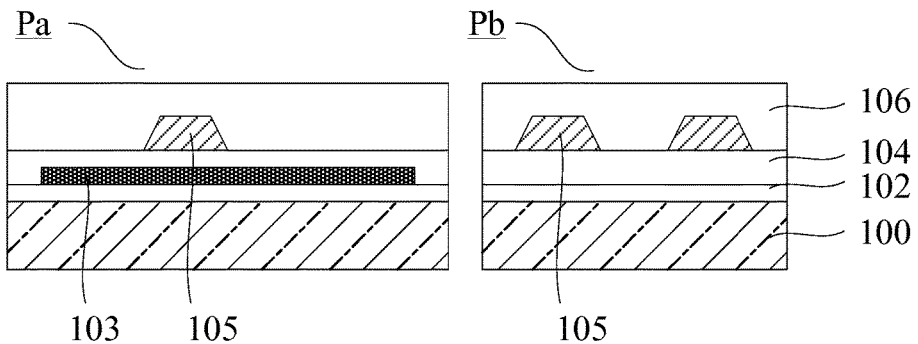

Particularly, referring to FIG. 3b to FIG. 3d, the step includes: forming the gate insulation layer 104 on the semiconductor layer 103; forming the gate metal layer 105 on the gate insulation layer 104 and patterning the gate metal layer 105; and forming the interlayer dielectric layer 106 on the gate metal layer 105. The gate insulation layer 104 and the interlayer dielectric layer 106 are the insulation layer as referred to in the present embodiment, and the gate insulation layer 104 and the interlayer dielectric layer 106 cover the semiconductor layer 103 and the substrate 100.

More particularly, as illustrated in FIG. 3b, the gate insulation layer 104 is formed on the semiconductor layer 103, the gate insulation layer 104 is formed through plasma enhanced chemical vapor deposition, and the gate insulation layer 104 can be a monolayer of silicon oxide or a monolayer of silicon nitride or can be a dual-layer structure of silicon oxide/silicon nitride. As illustrated in FIG. 3b, the gate insulation layer 104 covers the semiconductor layer 103 in the semiconductor layer 103 area, and the gate insulation layer 104 covers the buffer layer 102 in the other area.

As illustrated in FIG. 3c, the gate metal layer 105 is formed on the gate insulation layer 104 and patterned. Particularly a gate metal material layer is formed on the gate insulation layer 105 through sputtering; a photoresist layer is coated on the gate metal material layer and dried; the photoresist layer is exposed and developed, particularly by irradiating the photoresist layer with UV-rays using a mask in a predetermined pattern and removing the photoresist pattern of the irradiated part using alkaline developing solution after exposure to thereby form the photoresist pattern in the predetermined pattern; the gate metal material is etched, particularly by wet etching so that the gate metal material chemically reacts with etching liquid on the surface of the gate metal material and the substance of the gate metal material is consumed gradually as the chemical reaction proceeds constantly until all the gate metal material in the area uncovered by the photoresist is consumed; and the photoresist is stripped, that is, the remaining photoresist is removed using stripping liquid. So far the gate metal layer 105 is formed, where the gate metal layer can constitute a gate of a TFT switch component, a common electrode (not illustrated), etc., in the display area Pa, and the gate metal layer 105 can constitute metal wiring, etc., in the peripheral area Pb.

As illustrated in FIG. 3d, the interlayer dielectric layer 106 is formed on the gate metal layer 105, where the interlayer dielectric layer 106 can be a monolayer of silicon oxide or a monolayer of silicon nitride or can be a dual-layer structure of silicon oxide/silicon nitride in the same way that the gate insulation layer 104 is formed, i.e., by plasma enhanced chemical vapor deposition, and reference can be made to the step of forming the gate insulation layer 104 for details thereof, so a repeated description thereof will be omitted here. The interlayer dielectric layer 106 covers the gate metal layer 105 in the gate metal layer 105 area, and the interlayer dielectric layer 106 covers the gate insulation layer 104 in the other area.

The insulation layer as referred to in the present embodiment is an insulation multilayer of the gate insulation layer 104 and the interlayer dielectric layer 106, where the insulation layer covers the semiconductor layer 103 in the semiconductor layer 103 area, and the insulation layer covers the substrate 100 in the other area.

Further referring to FIG. 3, the step is performed: forming an electrostatic charge dispersion layer on the insulation layer.

Figure 3E:
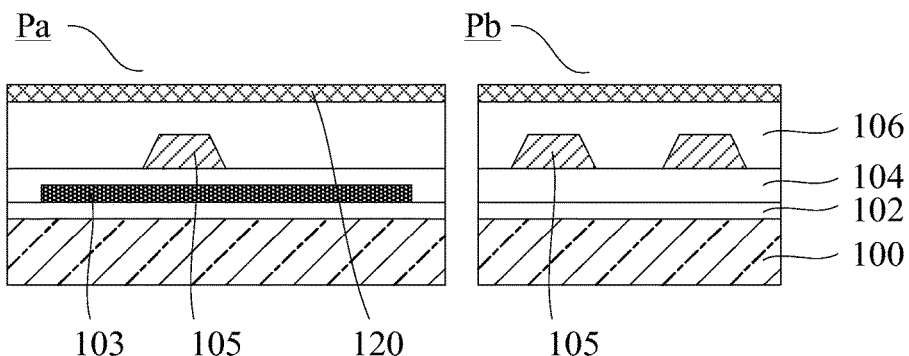

As illustrated in FIG. 3e, the electrostatic charge dispersion layer 120 is formed on the interlayer dielectric layer 106 so that the electrostatic charge dispersion layer 120 covers the entire surface of the substrate 100. The electrostatic charge dispersion layer 120 is formed by physical deposition, particularly by sputtering, i.e., bombarding a target to transfer the film material from the target onto the substrate. The material of the electrostatic charge dispersion layer 120 is at least one of molybdenum, titanium, iron, zinc, aluminum and magnesium or combination thereof, such materials have a high electrical conductive, and standard electrode potential of these materials are typically lower than an molybdenum alloy which is typically used as a gate material, and in a subsequent process, these materials can achieve electrostatic protection on the metal layer and the semiconductor layer below the electrostatic charge dispersion layer 120, and can achieve cathode protection to prevent the underlying metal from being electrochemically corrosion. The electrostatic charge dispersion layer 120 is made of the titanium metal in the present embodiment. The film thickness d of the electrostatic charge dispersion layer 120 ranges from 5 nm to 500 nm, so that better electrostatic protection can be achieved while the cost is controlled and a lower resistivity is maintained.

Further referring to FIG. 3, the step is performed: forming via holes in the insulation layer and the electrostatic charge dispersion layer so that the electrostatic charge dispersion layer covers the insulation layer other than the area of the via holes.

Figure 3F:
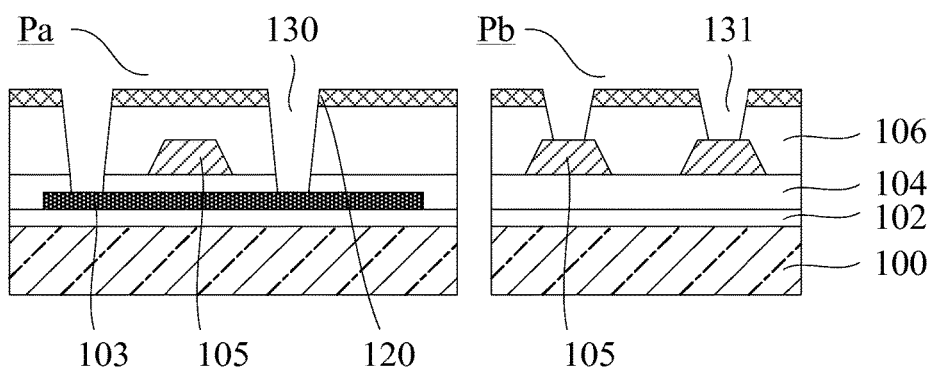

As illustrated in FIG. 3f, the via holes 130 are formed in the electrostatic charge dispersion layer 120, the interlayer dielectric layer 106 and the gate insulation layer 104 in the display area Pa, so that the electrostatic charge dispersion layer 120 covers the insulation layer 106 other than the area of the via holes; and the via holes 131 are formed in the electrostatic charge dispersion layer 120 and the interlayer dielectric layer 106 in the peripheral area Pb so that the electrostatic charge dispersion layer 120 covers the insulation layer 106 other than the area of the via holes.

Particularly the step of forming the via holes 130 and 131 in the electrostatic charge dispersion layer 120 and the insulation layer includes: forming a photoresist layer on the surface of the electrostatic charge dispersion layer 120; patterning the photoresist layer, particularly in exposure and development processes, where in the exposure process, the photoresist layer is irradiated with UV-rays using a mask in a predetermined pattern, and in the development process, the photoresist pattern of the irradiated part is removed using alkaline developing solution after the exposure process to thereby form the photoresist pattern in the predetermined pattern; etching the electrostatic charge dispersion layer 120 and the insulation layer to form the electrostatic charge dispersion layer and the insulation layer with the via holes; and removing the remaining photoresist layer.

More particularly the above step of etching the electrostatic charge dispersion layer 120 and the insulation layer includes: etching the electrostatic charge dispersion layer 120 so that the electrostatic charge dispersion layer 120 is inclined at the edges of the via holes 130 at an angle θ (not illustrated) ranging from 0° to 90° and preferably 30° to 60°; and etching the insulation layer. The electrostatic charge dispersion layer 120 is etched by wet etching, particularly in the same way as the gate metal layer 105 is etched, and reference can be made to the step of etching the gate metal layer 105, so a repeated description thereof will be omitted here. The etching insulation layer includes: etching the interlayer dielectric layer 106 and the gate insulation layer 104 in the display area Pa and etching the interlayer dielectric layer 106 in the peripheral area Pb. The etching process is performed by dry etching, particularly in the same way as the semiconductor layer 103 is etched, and reference can be made to the step of etching the semiconductor layer 103, so a repeated description thereof will be omitted here.

Cleaning and drying can be further performed after the photoresist is stripped to remove impurities on the surface of the substrate 100.

The substrate may be susceptible to electrostatic charges in the course of forming the via holes 130 and 131, in the course of stripping the photoresist, cleaning and drying after the via holes 130 and 131 are formed, and in the course of transporting the substrate. The electrostatic charges primarily arise from the following three aspects: frictional electrification including friction with the air, friction of the glass substrate with a brush and friction of the glass substrate with a base during transportation, washing friction with pure water during cleaning, friction of an air blade with the air, etc.; contact and separation electrification including separation of the glass substrate after coming into contact with the base, plasmas bombard, ion bombard, contact with agent liquid; and inductive electrification, e.g., electrostatic charges inductively generated in proximity to a charged object. The electrostatic charges may be easily released after being accumulated to some extent. Since the surface of the substrate is covered with the electrostatic charge dispersion layer 120 throughout the formation of the via holes, the electrostatic charges accumulated on the semiconductor layer 103 and the gate metal layer 105 can be released onto the surface of the electrostatic charge dispersion layer 120 through surface leakage over the high resistance of the air or otherwise, without incurring any electrostatic damage to the semiconductor layer 103 and the gate metal layer 105. Moreover a standard electrode potential of the titanium metal is typically lower than an molybdenum alloy which is typically used as a gate material, so that cathode protection can be achieved on the gate metal layer 105 below the electrostatic charge dispersion layer 120 in the course of forming the via holes, to thereby prevent the underlying metal from being electrochemically eroded.

Further referring to FIG. 3, the step is performed: forming a second film layer on the electrostatic charge dispersion layer, wherein the second film layer is electrically connected with the first film layer through the via holes.

Figure 3G:
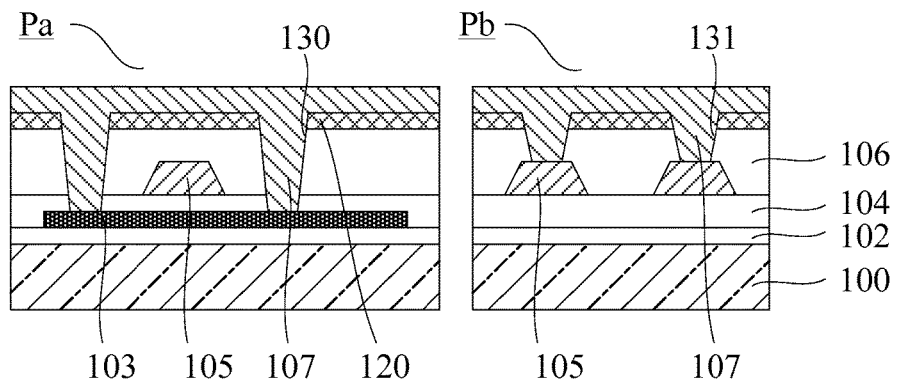

As illustrated in FIG. 3g, the source-drain metal layer 107 is formed on the electrostatic charge dispersion layer 120 so that the source-drain metal layer 107 covers the entire surface of the substrate 100. The source-drain metal layer 107 is electrically connected with the semiconductor layer 103 through the via holes 130 formed in the step descried above in the display area Pa; and the source-drain metal layer 107 is electrically connected with the gate metal layer 103 through the via holes 131 formed in the step described above in the peripheral area Pb. The second film layer as referred to in the present embodiment is the source-drain metal layer 107. The source-drain metal layer 107 is formed by physical deposition, particularly by sputtering, i.e., bombarding a target to transfer the film material from the target onto the substrate.

Further referring to FIG. 3, the step is performed: patterning the second film layer and the electrostatic charge dispersion layer so that the electrostatic charge dispersion layer is in the same profile as the second film layer.

Figure 3H:
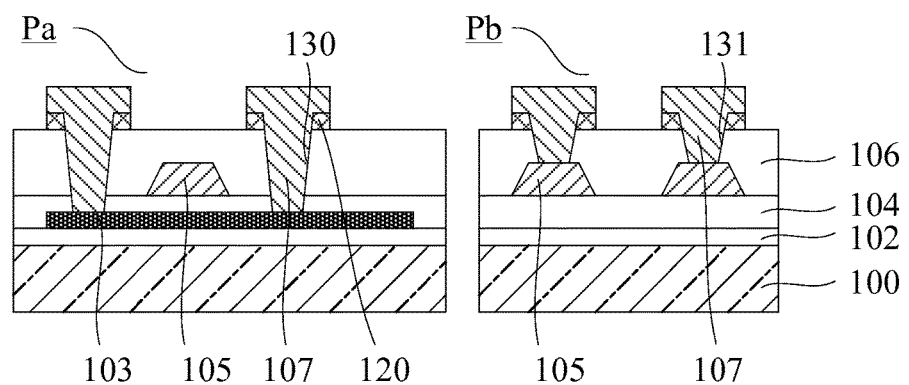

As illustrated in FIG. 3h, the source-drain metal layer 107 and the electrostatic charge dispersion layer 120 are patterned so that the electrostatic charge dispersion layer 120 is in the same profile as the source-drain metal layer 107.

Particularly a photoresist layer is formed on the surface of the second film layer, i.e., the source-drain metal layer 107; the photoresist layer is patterned, particularly by exposure and development, where the exposure and development processes are the same as the exposure and development processes of the photoresist in the step described above, so a repeated description thereof will be omitted here; the second film layer, i.e., the source-drain metal layer 107, and the electrostatic charge dispersion layer 120 are etched so that the electrostatic charge dispersion layer 120 is in the same profile as the source-drain metal layer; and the remaining photoresist layer is removed. Since both the source-drain metal layer 107 and the electrostatic charge dispersion layer 120 are metal material layers, the source-drain metal layer 107 and the electrostatic charge dispersion layer 120 can be etched in the same process step. With wet etching, the materials, of the source-drain metal layer 107 and electrostatic charge dispersion layer 120 in the areas uncovered by the photoresist, chemically react with etching liquid on the surfaces of the materials, and the metal materials are consumed gradually as the chemical reaction proceeds constantly until all the source-drain metal material and the electrostatic charge dispersion layer material in the areas uncovered by the photoresist are consumed so that the source-drain metal layer 107 is in the same profile as the electrostatic charge dispersion layer 120.

The electrostatic charge dispersion layer 120 directly contacts with the source-drain metal layer 107 so that the resistivity of the source-drain metal layer 107 can be lowered, to thereby improve delay attenuation of a display signal over a wire consisted of the source-drain metal layer so as to enhance a display quality.

Figure 3I:
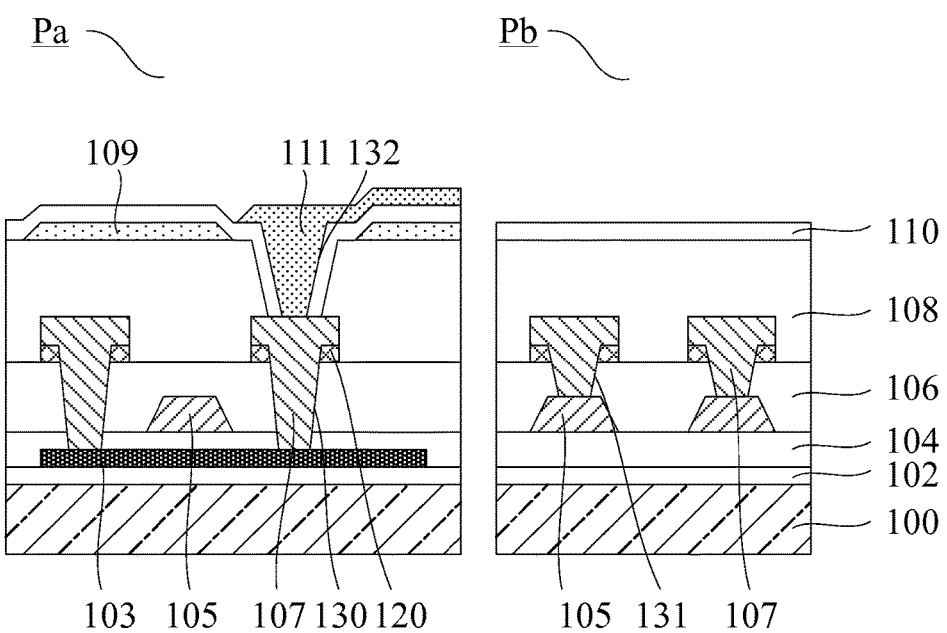

Further referring to FIG. 3i, after the source-drain metal layer 107 and the electrostatic charge dispersion layer 120 are patterned, the passivation layer 108 can be formed on the source-drain metal layer 107. The passivation layer 108 can be a monolayer of an organic passivation layer or an inorganic passivation layer or can be a multilayer of a silicon nitride/silicon oxide film and an organic passivation layer film/inorganic passivation layer film. After the passivation layer 108 is formed, the first transparent electrode layer 109, the interlayer insulation layer 110 and the second transparent electrode layer 111 are further formed, and the second transparent electrode layer 111 is electronically connected with the source-drain metal layer 107 through the via holes 132 and can be as a pixel electrode, and a plurality of slits (not illustrated) can be further formed in the second transparent electrode layer 111. In a practical implementation, the first transparent electrode layer can alternatively be electrically connected with the source-drain metal layer through the via holes and can be as a pixel electrode. Alternatively only the first transparent electrode can be formed on the passivation layer 108 and electrically connected with the source-drain metal layer and the second transparent electrode can be formed on the substrate opposite to the array substrate.

In the method of fabricating an array substrate according to the present embodiment, the electrostatic charge dispersion layer is formed in the fabrication process so that accumulation of electrostatic charges on the array substrate in the fabrication process of the substrate can be lowered, and a damage of the electrostatic charges to the semiconductor layer can be lowered so as to improve the stability and the uniformity of the TFT devices, avoid the TFT devices from being struck or damaged by the electrostatic charges to consequentially come with electrical drifting, and eliminate various electrostatic Muras. Moreover a poor display effect due to layer erosion or the like arising from discharging of the electrostatic charges can be improved to thereby improve a product yield. Moreover the electrostatic charge dispersion layer directly contacts with the source-drain metal layer so that the resistivity of the source-drain metal layer can be lowered to thereby improve delay attenuation of a display signal over a wire consisted of the source-drain metal layer thus enhancing a display quality. Moreover the electrostatic charge dispersion layer can be patterned using the same mask as the source-drain metal layer without any addition process step.

Figure 4:
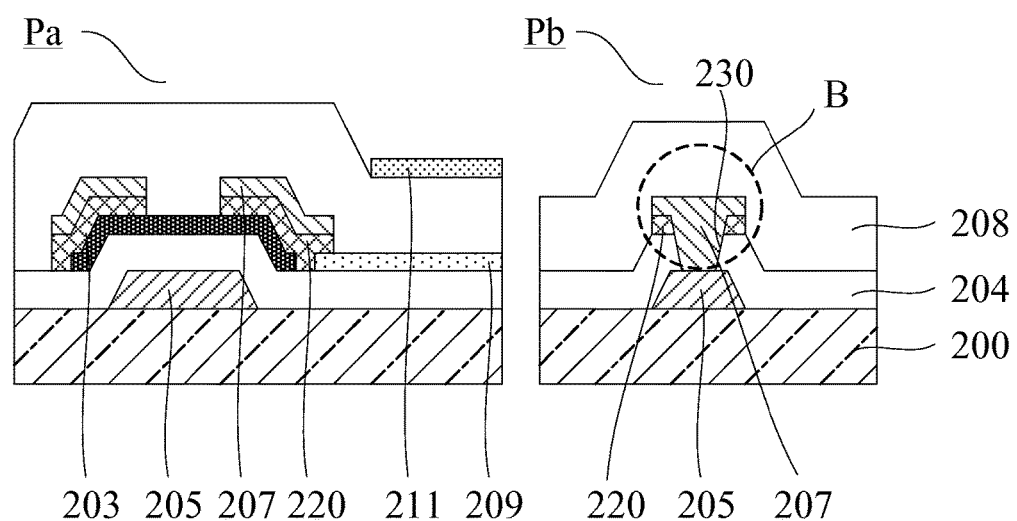
FIG. 4 illustrates a schematic structural diagram of another array substrate according to another embodiment of the present invention in a sectional view.

FIG. 4 illustrates a schematic structural diagram of another array substrate according to an embodiment of the invention in a sectional view, where Pa represents a display area of the array substrate, and Pb represents a peripheral area of the array substrate.

Referring to FIG. 4, the array substrate includes: a substrate 200, and a first film layer, an insulation layer, an electrostatic charge dispersion layer 220 and a second film layer arranged in order on one side surface of the substrate 200, where the insulation layer and the electrostatic charge dispersion layer are provided with via holes, and the second film layer is electrically connected with the first film layer through the via holes; and the electrostatic charge dispersion layer 220 is in the same profile as the second film layer. In the present embodiment, the first film layer is a gate metal layer 205, the insulation layer is a gate insulation layer 204, and the second film layer is a source-drain metal layer 207. Stated otherwise, in the present embodiment, the gate metal layer 205, the gate insulation layer 204, the electrostatic charge dispersion layer 220 and the source-drain metal layer 207 are formed in order on the substrate 200; the gate insulation layer 204 and the electrostatic charge dispersion layer 220 are provided thereon with the via holes 230, and the source-drain metal layer 207 is electrically connected with the gate metal layer 205 through the via holes 230; and the electrostatic charge dispersion layer 220 is in the same profile as the source-drain metal layer 207.

In the present embodiment, the substrate 200 can be a base substrate based upon an inorganic material, such as a glass substrate, a quartz substrate, etc., or can be a base substrate made of an organic material.

The gate metal layer 205 is formed on the substrate 200. The gate metal layer 205 can constitute as a gate of a TFT device, common electrode wiring (not illustrated), etc., in the display area Pa, and the gate metal layer 205 can constitute a peripheral circuit, e.g., a gate driving circuit, etc., in the peripheral area Pb, and the gate metal layer 205 is typically made of a material of molybdenum, a molybdenum alloy, aluminum, an aluminum alloy, etc.

The gate insulation layer 204 is formed on the gate metal layer 205. The gate insulation layer 204 is typically made of silicon nitride, silicon oxide or a mixture of both. The gate insulation layer 204 covers the gate metal layer 205 and the substrate 200.

A semiconductor layer 203 and a first transparent electrode layer 209 are formed on the gate insulation layer 204. The semiconductor material of the semiconductor layer 203 can be amorphous silicon, an oxide semiconductor or poly-silicon, and since the amorphous silicon is easily available, the amorphous silicon is adopted as the semiconductor material in the present embodiment, and the semiconductor layer is formed in a TFT device area and opposite to the gate consisted of the gate metal layer 205. The first transparent electrode layer 209 is formed in a pixel opening area. The gate insulation layer 204 is partially covered by the semiconductor layer 203 and the first transparent electrode layer 209.

The electrostatic charge dispersion layer 220 is formed on the semiconductor layer 203, the first transparent electrode layer 209 and the gate insulation layer 204. The electrostatic charge dispersion layer 220 partially covers the semiconductor layer 203, the first transparent electrode layer 209 and the gate insulation layer 204 in the display area Pa, and the electrostatic charge dispersion layer 220 partially covers the gate insulation layer 204 in the peripheral area Pb. The material of the electrostatic charge dispersion layer 220 is at least one of molybdenum, titanium, iron, zinc, aluminum and magnesium or combination thereof, such materials have a high electrical conductive, and standard electrode potential of these materials are typically lower than an molybdenum alloy which is typically used as a gate material, so that these materials can achieve a function of electrostatic protection on the gate metal layer 205 below the electrostatic charge dispersion layer 220 in the peripheral area Pb after the electrostatic charge dispersion layer 220 is formed until the source-drain metal layer 207 is formed, and can achieve a function of cathode protection, to prevent the gate metal layer 205 from being electrochemically corrosion. Moreover the film thickness d of the electrostatic charge dispersion layer 220 ranges from 5 nm to 500 nm, so that better electrostatic protection can be achieved while the cost is controlled and a lower resistivity is maintained.

The source-drain metal layer 207 is formed on the electrostatic charge dispersion layer 220. The source-drain metal layer 207 is electrically connected with the semiconductor layer 203 and the first transparent electrode layer 209 through the electrostatic charge dispersion layer 220 in the display area Pa; and the source-drain metal layer 207 is electrically connected with the gate metal layer 205 through the via holes 230 of the electrostatic charge dispersion layer 220 and the gate insulation layer 204 in the peripheral area Pb. Moreover the electrostatic charge dispersion layer 220 is in the same profile as the source-drain metal layer 207, where the profiles of the electrostatic charge dispersion layer 220 and the source-drain metal layer 207 can be formed in the same process step in the preparation process with any addition process step.

A passivation layer 208 is formed on the source-drain metal layer 207. The passivation layer 208 can be a monolayer of an organic passivation layer or an inorganic passivation layer or can be a multilayer of a silicon nitride film or a silicon oxide film, and an organic passivation layer film or an inorganic passivation layer film. In the present embodiment, a second transparent electrode layer 211 is further formed on the passivation layer 208 in the display area Pa, and a plurality of slits (not illustrated) can be formed in the second transparent electrode layer 211.

In the present embodiment, the first transparent electrode layer 209 is formed below the passivation layer 208 and electrically connected with the source-drain metal layer 207 through the electrostatic charge dispersion layer 220. In a practical implementation, the first transparent electrode layer can be formed above the second transparent electrode layer, and an interlayer insulation layer can be further formed between the first transparent electrode layer and the second transparent electrode layer, so that the first transparent electrode layer is insulated from the second transparent electrode layer, and the first transparent electrode layer or the second transparent electrode layer is electrically connected with the source-drain metal layer through the via holes. Alternatively the first transparent electrode layer may not be formed on the array substrate, but only the second transparent electrode layer can be formed on the passivation layer 108 and electrically connected with the source-drain metal layer through the via holes, and the first transparent electrode layer can be formed on an opposite substrate opposite to the array substrate.

Figure 5:
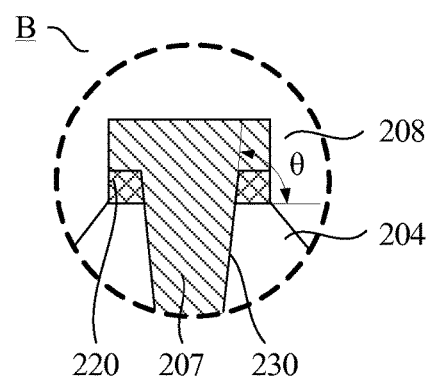
FIG. 5 illustrates a schematic enlarged diagram of the region B in FIG. 4.

More particularly, FIG. 5 illustrates a schematic enlarged diagram of the region B in FIG. 5. Referring to FIG. 4 and FIG. 5, the electrostatic charge dispersion layer 220, the source-drain metal layer 207 and the passivation layer 208 are formed in order on the gate insulation layer 204, and the electrostatic charge dispersion layer 220 and the gate insulation layer 204 are provided with the via holes 230. The electrostatic charge dispersion layer 220 is inclined at the via holes at an angle θ ranging from 0° to 90° and preferably 30° to 60°, and due to the inclination angle of the electrostatic charge dispersion layer here, electrostatic charges accumulated on the substrate can be more easily discharged on the electrostatic charge dispersion layer 220 by surface leakage, etc., to thereby achieve a better electrostatic protection effect.

The array substrate according to the present embodiment includes the electrostatic charge dispersion layer so that accumulation of electrostatic charges on the array substrate in the fabrication process of the substrate can be lowered. In the peripheral area, a poor display effect due to layer erosion or the like arising from discharging of the electrostatic charges can be improved to thereby improve a product yield. Moreover the electrostatic charge dispersion layer directly contacts with the source-drain metal layer so that the resistivity of the source-drain metal layer can be lowered to thereby improve delay attenuation of a display signal over a wire consisted of the source-drain metal layer thus enhancing a display quality.

FIG. 6 illustrates schematic structural diagrams of a flow of fabricating the array substrate in FIG. 4 in sectional views.

Referring to FIG. 6, the step is performed: preparing a substrate and forming a first film layer on one side surface of the substrate.

Figure 6A:
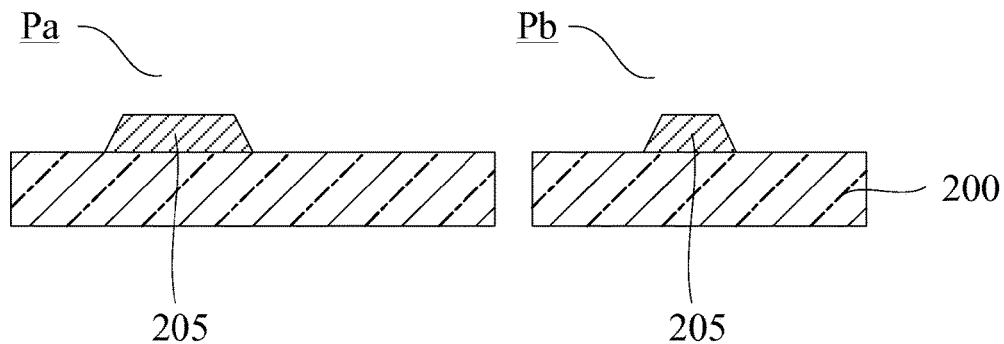
FIGS. 6a-6g illustrate schematic structural diagrams of a flow of fabricating the array substrate in FIG. 4 in sectional views.

Particularly, referring to FIG. 6a, this step includes: preparing the substrate 200 and forming the gate metal layer 205 on the substrate 200 and patterning it, where the gate metal layer 205 is the first film layer as referred to in the present embodiment.

The step of forming the gate metal layer 205 and patterning it particularly includes: forming a gate metal material layer through physical deposition, particularly by sputtering, i.e., bombarding a target to transfer the film material from the target onto the substrate; coating a photoresist layer on the gate metal material layer and drying the photoresist layer; exposing and developing the photoresist layer, particularly by irradiating the photoresist layer with UV-rays using a mask in a predetermined pattern and removing the photoresist pattern of the irradiated part using alkaline developing solution after exposure, to thereby form the photoresist pattern in the predetermined pattern; etching the gate metal material, particularly by wet etching, so that the gate metal material chemically reacts with etching liquid on the surface of the gate metal material and the gate metal material is consumed gradually as the chemical reaction proceeds constantly until all the gate metal material in the area uncovered by the photoresist is consumed; and stripping the photoresist, that is, removing the remaining photoresist using stripping liquid. So far the gate metal layer 205 is formed. The gate metal layer can constitute a gate of a TFT switch component, a common electrode (not illustrated), etc., in the display area Pa, and the gate metal layer 205 can constitute metal wiring, etc., in the peripheral area Pb.

Further referring to FIG. 6, the step is performed: forming an insulation layer on the first film layer, wherein the insulation layer covers the first film layer and the substrate.

Figure 6B:
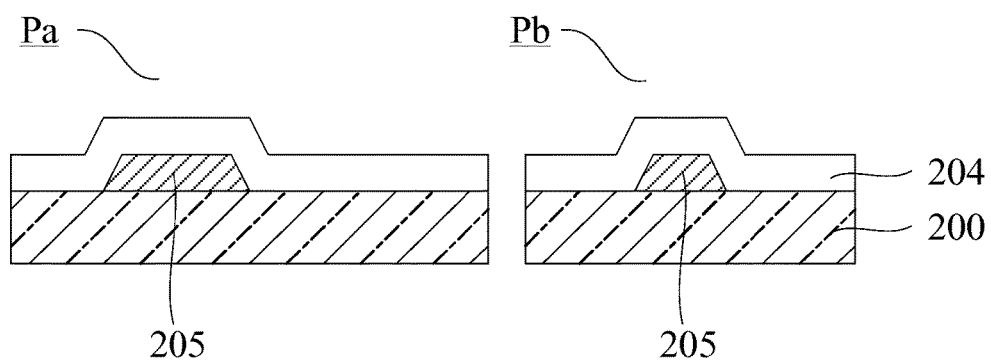

Particularly, referring to FIG. 6b, the step includes: forming the gate insulation layer 204 on the gate metal layer 205, the gate insulation layer covers the gate metal layer 205 and the substrate 200, where the gate insulation layer 204 is the insulation layer as referred to in the present embodiment.

More particularly the gate insulation layer 204 is formed by plasma enhanced chemical vapor deposition, and the gate insulation layer 204 can be a monolayer of silicon oxide or a monolayer of silicon nitride or can be a multilayer structure of silicon oxide/silicon nitride. As illustrated in FIG. 6b, the gate insulation layer 204 covers the gate metal layer 205 in the gate metal layer 205 area, and the gate insulation layer 204 covers the substrate 200, in the other area.

Further referring to FIG. 6, the step is performed: forming an electrostatic charge dispersion layer on the insulation layer.

Figure 6C:
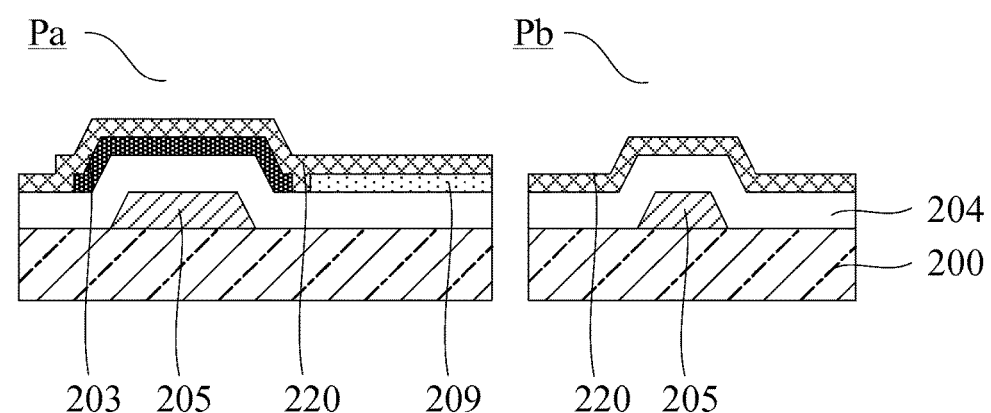

As illustrated in FIG. 6c, the semiconductor layer 203 and the first transparent electrode layer 209 are formed on the gate insulation layer 204 before the electrostatic charge dispersion layer 220 is formed on the gate insulation layer 204. It shall be noted that the semiconductor layer 203 can be formed before the first transparent electrode layer 209 is formed or can be formed after the first transparent electrode layer 209 is formed in the present embodiment.

More particularly the forming the semiconductor layer 203 on the gate insulation layer 204 particularly includes: depositing an amorphous silicon material on one side surface of the substrate 200 and patterning the amorphous silicon material. The amorphous silicon material is deposited by plasma enhanced chemical vapor deposition. After the amorphous silicon material is deposited, the amorphous silicon material is patterned to form semiconductor layer 203 in the display area Pa, and to form the semiconductor layer in an area where the amorphous silicon material needs to be reserved, e.g., a transistor area of a gate driving circuit (not illustrated), in the peripheral area Pb, while all the amorphous silicon material in the other area needs to be etched away. In a particular patterning process, a photoresist layer is coated on the amorphous silicon material layer and dried; the photoresist layer is exposed and developed, particularly by irradiating the photoresist layer with UV-rays using a mask in a predetermined pattern and removing the photoresist pattern of the irradiated part using alkaline developing solution after exposure, to thereby form the photoresist pattern in the predetermined pattern; the amorphous silicon material is etched, particularly by dry etching so that a volatile reactant is generated after ion radicals in plasmas are adhered to the surface of the amorphous silicon material; and the photoresist is stripped, that is, the remaining photoresist is removed using stripping liquid. So far the semiconductor layer 203 is formed. In a practical operation process, the substrate needs to be cleaned and dried to remove impurities on the surface of the substrate before and after each of the steps of coating, exposing and developing, etching, stripping the photoresist, etc.

The first transparent electrode 209 is formed in the same process as the formation of the gate metal layer 205, except that the target adopted for the first transparent electrode 209 is a transparent electrically-conductive material such as indium tin oxide, indium zinc oxide or another oxide, etc., so a repeated description thereof will be omitted here.

After the steps above are performed, the electrostatic charge dispersion layer 220 is formed on the gate insulation layer 204, the semiconductor layer 203 and the first transparent electrode layer 209 so that the electrostatic charge dispersion layer 220 covers the entire surface of the substrate 200. The electrostatic charge dispersion layer 220 is formed by physical deposition, particularly by sputtering, i.e., bombarding a target to transfer the film material from the target onto the substrate. The material of the electrostatic charge dispersion layer 220 is at least one of molybdenum, titanium, iron, zinc, aluminum and magnesium or combination thereof, such materials have a high electrical conductive, and standard electrode potential of these materials are typically lower than an molybdenum alloy which is typically used as a gate material, and in a subsequent process, these materials can achieve a function of electrostatic protection on the gate metal layer 205 below the electrostatic charge dispersion layer 220, and can achieve a function of cathode protection to prevent the underlying gate metal layer 205 from being electrochemically corrosion. The electrostatic charge dispersion layer 220 is made of the titanium metal in the present embodiment. The film thickness d of the electrostatic charge dispersion layer 220 ranges from 5 nm to 500 nm, so that better electrostatic protection can be achieved while the cost is controlled and a lower resistivity is maintained.

Further referring to FIG. 6, the step is performed: forming via holes in the insulation layer and the electrostatic charge dispersion layer so that the electrostatic charge dispersion layer covers the insulation layer other than the area of the via holes.

Figure 6D:
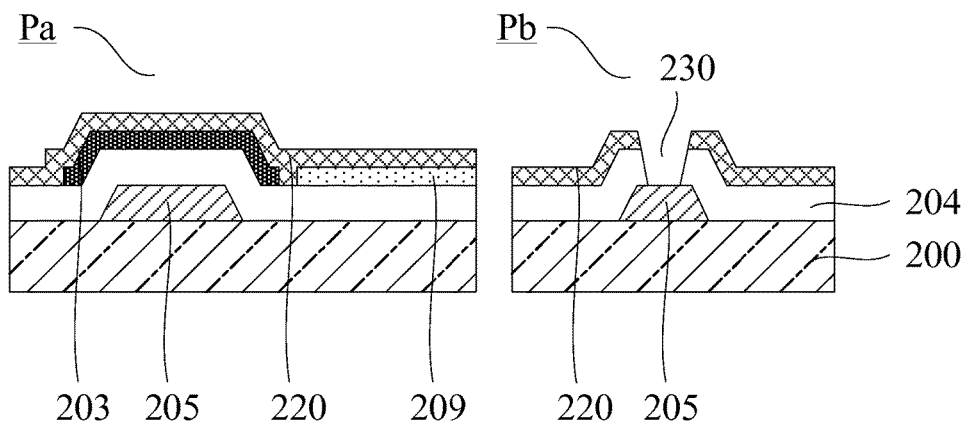

As illustrated in FIG. 6d, the via holes 230 are formed in the electrostatic charge dispersion layer 220 and the gate insulation layer 204 in peripheral area Pb, so that the electrostatic charge dispersion layer 220 covers the insulation layer 206 other than the area of the via holes 230; and no via holes are formed in the display area Pa.

Particularly the step of forming the via holes 230 in the electrostatic charge dispersion layer 220 and the gate insulation layer 204 includes: forming a photoresist layer on the surface of the electrostatic charge dispersion layer 220; patterning the photoresist layer, particularly including exposure and development processes, where in the exposure process, the photoresist layer is irradiated with UV-rays using a mask in a predetermined pattern, and in the development process, the photoresist pattern of the irradiated part is removed using alkaline developing solution after the exposure process, to thereby form the photoresist pattern in the predetermined pattern; etching the electrostatic charge dispersion layer 220 and the gate insulation layer 204 to form the electrostatic charge dispersion layer 220 and the gate insulation layer 204 with the via holes; and removing the remaining photoresist layer.

More particularly the step of etching the electrostatic charge dispersion layer 220 and the gate insulation layer 204 includes: etching the electrostatic charge dispersion layer 220 so that the electrostatic charge dispersion layer 220 is inclined at the edges of the via holes at an angle $\theta$ (not illustrated) ranging from 0° to 90° and preferably 30° to 60°; and etching the insulation layer 204. The electrostatic charge dispersion layer 220 is etched by wet etching, particularly in the same way as the gate metal layer 205 is etched, and reference can be made to the step of etching the gate metal layer 205, so a repeated description thereof will be omitted here. The gate insulation layer 204 is etched by dry etching, particularly in the same way as the semiconductor layer 203 is etched, and reference can be made to the step of etching the semiconductor layer 203, so a repeated description thereof will be omitted here.

Cleaning and drying can be further performed after the photoresist is stripped to remove impurities on the surface of the substrate 200.

The substrate may be susceptible to electrostatic charges in the course of forming the via holes 230, in the course of stripping the photoresist and cleaning and drying after the via holes are formed, and in the course of transporting the substrate. The electrostatic charges primarily arise from the following three aspects: frictional electrification including friction with the air, friction of the glass substrate with a brush and friction of the glass substrate with a base during transportation, washing friction with pure water during cleaning, friction of an air blade with the air, etc.; contact and separation electrification including separation of the glass substrate after coming into contact with the base, plasmas bombard, ion bombard, contact with agent liquid; and inductive electrification, e.g., electrostatic charges inductively generated in proximity to a charged object. The electrostatic charges may be easily released after being accumulated to some extent. Since the surface of the substrate is covered with the electrostatic charge dispersion layer 220 throughout the formation of the via holes 230, the electrostatic charges accumulated on the gate metal layer 205 can be released onto the surface of the electrostatic charge dispersion layer 220 through surface leakage over the high resistance of the air or otherwise without incurring any electrostatic damage to the gate metal layer 205. Moreover a standard electrode potential of the titanium metal is typically lower than an molybdenum alloy which is typically used as a gate material so that cathode protection can be achieved on the gate metal layer 205 below the electrostatic charge dispersion layer 220 in the course of forming the via holes to thereby prevent the underlying metal from being electrochemically eroded.

Further referring to FIG. 6, the step is performed: forming a second film layer on the electrostatic charge dispersion layer, wherein the second film layer is electrically connected with the first film layer through the via holes.

Figure 6E:
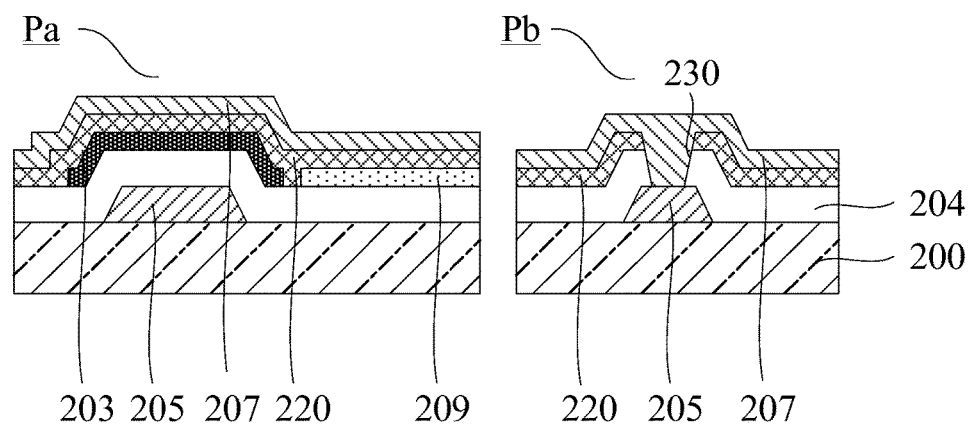

As illustrated in FIG. 6e, the source-drain metal layer 207 is formed on the electrostatic charge dispersion layer 220 so that the source-drain metal layer 207 covers the entire surface of the substrate 200. The source-drain metal layer 207 is electrically connected with the semiconductor layer 203 through the electrostatic charge dispersion layer 220 in the display area Pa; and the source-drain metal layer 207 is electrically connected with the gate metal layer 203 through the via holes 230 formed in the step described above in the peripheral area Pb. The second film layer as referred to in the present embodiment is the source-drain metal layer 207. The source-drain metal layer 207 is formed by physical deposition, particularly by sputtering, i.e., bombarding a target to transfer the film material from the target onto the substrate.

Further referring to FIG. 6, the step is performed: patterning the second film layer and the electrostatic charge dispersion layer so that the electrostatic charge dispersion layer is in the same profile as the second film layer.

Figure 6F:
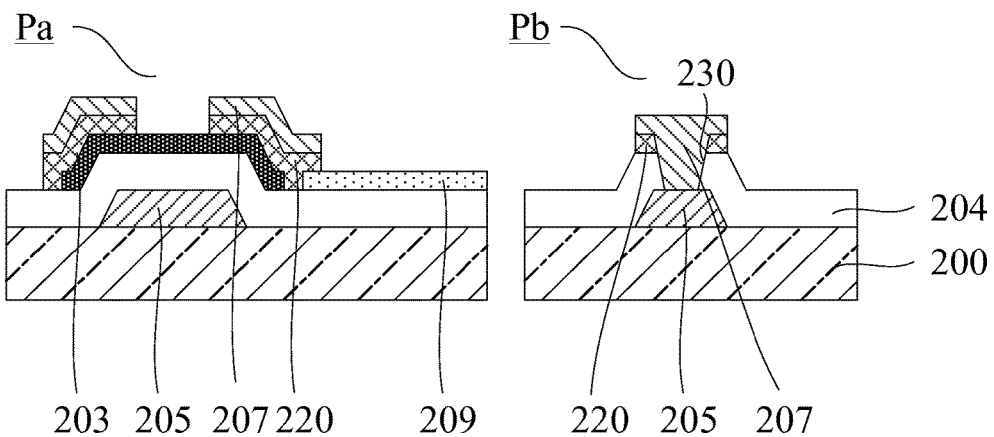

As illustrated in FIG. 6f, the source-drain metal layer 207 and the electrostatic charge dispersion layer 220 are patterned so that the electrostatic charge dispersion layer 220 is in the same profile as the source-drain metal layer 207.

Particularly a photoresist layer is formed on the surface of the second film layer, i.e., the source-drain metal layer 207; the photoresist layer is patterned, particularly by exposure and development, where the exposure and development processes are the same as the exposure and development processes of the photoresist in the step described above, so a repeated description thereof will be omitted here; the second film layer, i.e., the source-drain metal layer 207, and the electrostatic charge dispersion layer 220 are etched so that the electrostatic charge dispersion layer 220 is in the same profile as the source-drain metal layer 207; and the remaining photoresist layer is removed. Since both the source-drain metal layer 207 and the electrostatic charge dispersion layer 220 are metal material layers, the source-drain metal layer 207 and the electrostatic charge dispersion layer 220 can be etched in the same process step. With wet etching, the materials, of the source-drain metal layer 207 and electrostatic charge dispersion layer 220 in the areas uncovered by the photoresist, chemically react with etching liquid on the surfaces of the materials and the metal materials are consumed gradually as the chemical reaction proceeds constantly until all the source-drain metal material and the electrostatic charge dispersion layer material in the areas uncovered by the photoresist are consumed so that the source-drain metal layer 207 is in the same profile as the electrostatic charge dispersion layer 220.

The electrostatic charge dispersion layer 220 directly contacts with the source-drain metal layer 207 so that the resistivity of the source-drain metal layer 207 can be lowered to thereby improve delay attenuation of a display signal over a wire consisted of the source-drain metal layer thus enhancing a display quality.

Figure 6G:
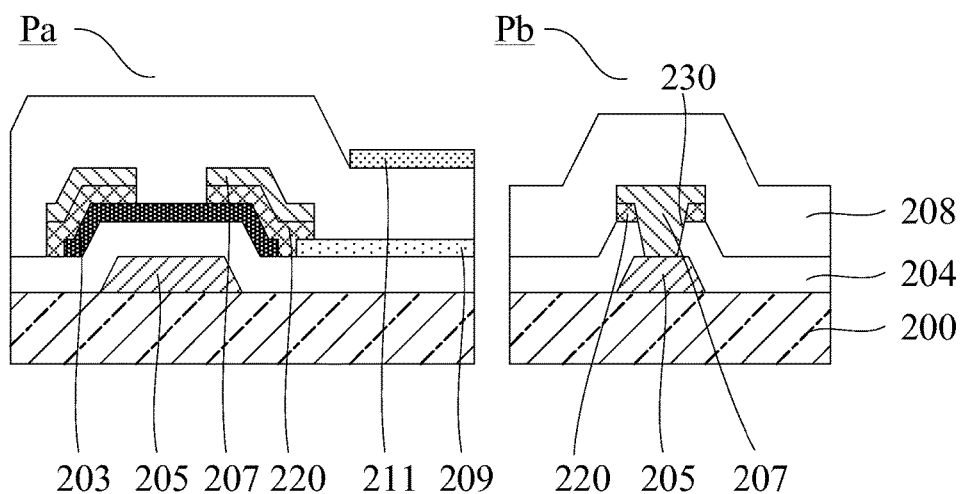

Further referring to FIG. 6g, after the source-drain metal layer 207 and the electrostatic charge dispersion layer 220 are patterned, the passivation layer 208 can be formed on the source-drain metal layer 207. The passivation layer 208 can be a monolayer of an organic passivation layer or an inorganic passivation layer or can be a multilayer of a silicon nitride/silicon oxide film and an organic passivation layer film/inorganic passivation layer film. After the passivation layer 208 is formed, the second transparent electrode layer 211 is further formed as a common electrode, and a plurality of slits (not illustrated) can be further formed in the second transparent electrode layer 211. The second transparent electrode layer 211 is formed in the same way as the formation of the first transparent electrode layer 209 described above, so a repeated description thereof will be omitted here.

In the method of fabricating an array substrate according to the present embodiment, the electrostatic charge dispersion layer is formed in the fabrication process so that accumulation of electrostatic charges on the array substrate in the fabrication process of the substrate can be lowered. A poor display effect due to layer erosion or the like arising from discharging of the electrostatic charges can be improved to thereby improve a product yield. Moreover the electrostatic charge dispersion layer directly contacts with the source-drain metal layer so that the resistivity of the source-drain metal layer can be lowered to thereby improve delay attenuation of a display signal over a wire consisted of the source-drain metal layer thus enhancing a display quality. Moreover the electrostatic charge dispersion layer can be patterned using the same mask as the source-drain metal layer without any addition process step.

Figure 7:
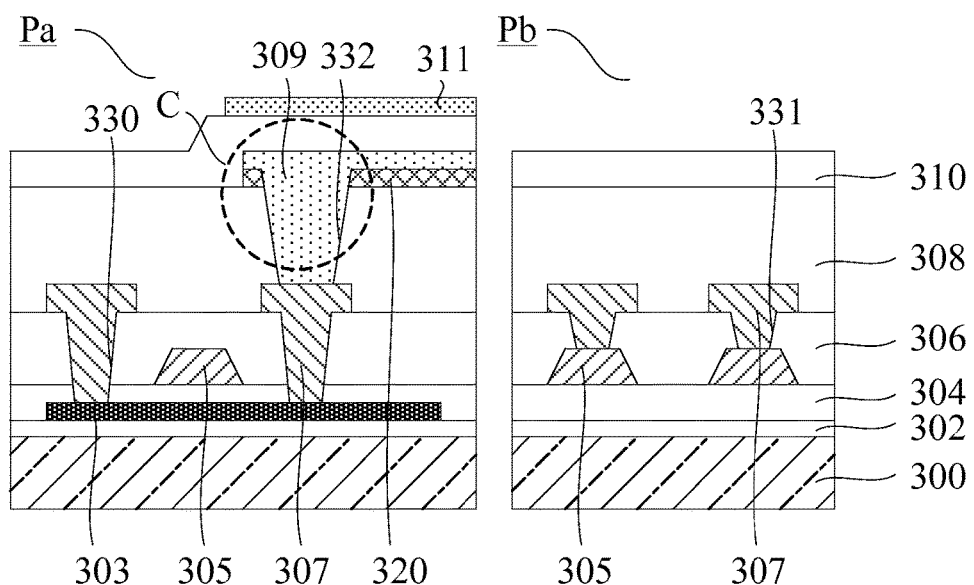
FIG. 7 illustrates a schematic structural diagram of a further array substrate according to another embodiment of the present invention in a sectional view.

FIG. 7 illustrates a schematic structural diagram of a further array substrate according to an embodiment of the invention in a sectional view, where Pa represents a display area of the array substrate, and Pb represents a peripheral area of the array substrate.

Referring to FIG. 7, the array substrate includes: a substrate 300, and a first film layer, an insulation layer, an electrostatic charge dispersion layer 320 and a second film layer arranged in order on one side surface of the substrate 300, where the insulation layer and the electrostatic charge dispersion layer are provided with via holes, and the second film layer is electrically connected with the first film layer through the via holes; and the electrostatic charge dispersion layer 320 is in the same profile as the second film layer. In the present embodiment, the first film layer is a source-drain metal layer 307, the insulation layer is a passivation layer 308, and the second film layer is a first transparent electrode layer 309. Stated otherwise, in the present embodiment, the source-drain metal layer 307, the passivation layer 308, the electrostatic charge dispersion layer 320 and the first transparent electrode layer 309 are formed in order on the substrate 300; the passivation layer 308 and the electrostatic charge dispersion layer 320 are provided thereon with the via holes 332, and the first transparent electrode layer 309 is electrically connected with the source-drain metal layer 307 through the via holes 332; and the electrostatic charge dispersion layer 320 is in the same profile as the first transparent electrode layer 309.

More particularly, further referring to FIG. 7, the array substrate according to the present embodiment further includes the substrate 300, a buffer layer 302, a semiconductor layer 303, a gate insulation layer 304, a gate metal layer 305 and an interlayer dielectric layer 306.

In the present embodiment, the substrate 300 can be a base substrate based upon an inorganic material, such as a glass substrate, a quartz substrate, etc., or can be a substrate made of an organic material.

The buffer layer 302 is typically formed on the substrate 300 to thereby prevent metal ions in the substrate 300, e.g., aluminum ions, barium ions, sodium ions, etc., from being diffused into an active area of the semiconductor layer 303 in a thermal process and lower the thermal conductivity. The buffer layer 302 is typically made of silicon nitride, silicon oxide or a mixture of both. Typically a light shielding layer (not illustrated) can be further formed at a location on the substrate corresponding to the semiconductor active area to thereby prevent an influence of backlight on the semiconductor, where the light shielding layer is typically made of a very thin metal material.

The semiconductor layer 303 is formed on the buffer layer 302. The semiconductor material can be amorphous silicon, an oxide semiconductor or poly-silicon, where the poly-silicon is adopted as the semiconductor material in the present embodiment due to its high electron mobility. The semiconductor layer 303 further includes an active area and a source-drain connection area (not illustrated).

The gate insulation layer 304 is formed on the semiconductor layer 303. The gate insulation layer 304 is typically made of silicon nitride, silicon oxide or a mixture of both.

The gate metal layer 305 is formed on the gate insulation layer 304. The gate metal layer 305 can constitute the gates of TFT devices, a common electrode (not illustrated), etc., in the display area Pa, and the gate metal layer 305 can constitute a peripheral circuit, e.g., a gate driving circuit in the peripheral area Pb. The gate metal layer is typically made of a material of molybdenum, a molybdenum alloy, aluminum, an aluminum alloy, etc.

The interlayer dielectric layer 306 is formed on the gate metal layer 305. The interlayer dielectric layer 306 can be a monolayer made of silicon oxide, silicon nitride or a mixture of both, or can be a multilayer of stacked silicon oxide and silicon nitride.

The source-drain metal layer 307, i.e., the first film layer as referred to as in the present embodiment, is formed on the interlayer dielectric layer 306. The source-drain metal layer 307 is electrically connected with the semiconductor layer 303 through the via holes in the interlayer dielectric layer 306 and the via holes 330 in the gate insulation layer 304 in the display area Pa; and the source-drain metal layer 307 is electrically connected with the gate metal layer 305 through the via holes 331 in the interlayer dielectric layer 306 in the peripheral area Pb.

It shall be noted that the TFT devices in a top-gate structure are described in the present embodiment, but in a practical implementation, TFT devices in a bottom-gate structure can alternatively be formed, that is, the gates, the gate insulation layer, the semiconductor layer and the source-drain metal layer are formed in order on the substrate.

Further referring to FIG. 7, the passivation layer 308 is formed on the source-drain metal layer 307. The passivation layer 308 can be a monolayer of an organic passivation layer or an inorganic passivation layer or can be a multilayer of a silicon nitride/silicon oxide film and an organic passivation layer film/inorganic passivation layer film.

The electrostatic charge dispersion layer 320 is formed on the passivation layer 308, where the material of the electrostatic charge dispersion layer 320 is indium tin oxide or indium zinc oxide, which has a high electrical conductivity and has no any influence upon transmittance. The electrostatic charge dispersion layer 320 can achieve a function of electrostatic protection on the metal layer and the semiconductor layer below the electrostatic charge dispersion layer 320 after the electrostatic charge dispersion layer 320 is formed until the first transparent electrode layer 309 is formed. Moreover the film thickness d of the electrostatic charge dispersion layer 320 ranges from 5 nm to 500 nm, so that better electrostatic protection can be achieved while the cost is controlled and a lower resistivity is maintained.

The first transparent electrode layer 309 is formed on the electrostatic charge dispersion layer 320. The first transparent electrode layer 309 is electrically connected with the source-drain metal layer 307 through the via holes 332 of the passivation layer 308 and the electrostatic charge dispersion layer 320 in the display area Pa. Moreover the electrostatic charge dispersion layer 320 is in the same profile as the first transparent electrode layer 309, where the profiles of the electrostatic charge dispersion layer 320 and the first transparent electrode layer 309 can be formed in the same process step in the preparation process without any addition process step.

An interlayer insulation layer 310 and a second transparent electrode layer 311 can be further formed on the first transparent electrode layer. The interlayer insulation layer 310 is made of one or two of silicon oxide, silicon nitride and silicon oxynitride and preferably silicon nitride. The second transparent electrode layer 311 is made of indium tin oxide and indium zinc oxide. A plurality of slits (not illustrated) are formed in the second transparent electrode layer 311.

It shall be noted that in the present embodiment, the display panel with liquid crystals being driven in the horizontal electric field pattern is described by way of an example, and the first transparent electrode layer 309 is as a pixel electrode. In a practical implementation, alternatively the first transparent electrode layer can include a connection section and an electrode section, and the second transparent electrode layer can be electrically connected with the connection section through the via holes for electrical connection with the source-drain metal layer to be as a pixel electrode. In a practical implementation, alternatively only the first transparent electrode layer can be formed on the array substrate and patterned into two sections insulated from each other, which can be as a pixel electrode and a common electrode respectively; or only the first transparent electrode layer can be formed on the array substrate while the second transparent electrode is formed on a substrate opposite to the array substrate.

Figure 8:
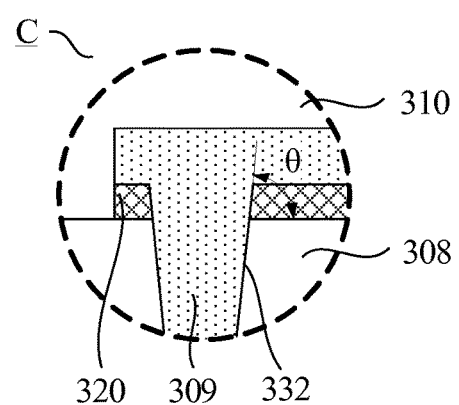
FIG. 8 illustrates a schematic enlarged diagram of the region C in FIG. 7.

More particularly, FIG. 8 illustrates a schematic enlarged diagram of the region C in FIG. 7. Referring to FIG. 7 and FIG. 8, the electrostatic charge dispersion layer 320, the first transparent electrode layer 309 and the interlayer insulation layer 310 are formed in order on the passivation layer 308, and the electrostatic charge dispersion layer 320 and the passivation layer 308 are provided with the via holes 332. The electrostatic charge dispersion layer 320 is inclined at the via holes 332 at an angle θ ranging from 0° to 90° and preferably 30° to 60°. Due to the inclination angle of the electrostatic charge dispersion layer here, electrostatic charges accumulated on the substrate can be more easily discharged on the electrostatic charge dispersion layer 320 by surface leakage, etc., to thereby achieve a better electrostatic protection effect.

The array substrate according to the present embodiment includes the electrostatic charge dispersion layer so that accumulation of electrostatic charges on the array substrate in the fabrication process of the substrate can be lowered, and the source-drain metal layer is electrically connected with the semiconductor layer in the display area so that the charges accumulated on the semiconductor layer and the source-drain metal layer can be released onto the surface of the electrostatic charge dispersion layer by surface leakage to thereby lower a damage of the electrostatic charges to the semiconductor layer thus improving the stability and the uniformity of the TFT devices, avoiding the TFT devices from being struck or damaged by the electrostatic charges to consequentially come with electrical drifting, and eliminate various electrostatic Muras. Moreover the electrostatic charge dispersion layer directly contacts with the first transparent electrode layer so that the resistivity of the first transparent electrode layer can be lowered to thereby improve a display quality.

FIG. 9 illustrates schematic structural diagrams of a flow of fabricating the array substrate in FIG. 7 in sectional views.

Referring to FIG. 9, the step is performed: preparing a substrate and forming a first film layer on one side surface of the substrate.

Figure 9A:
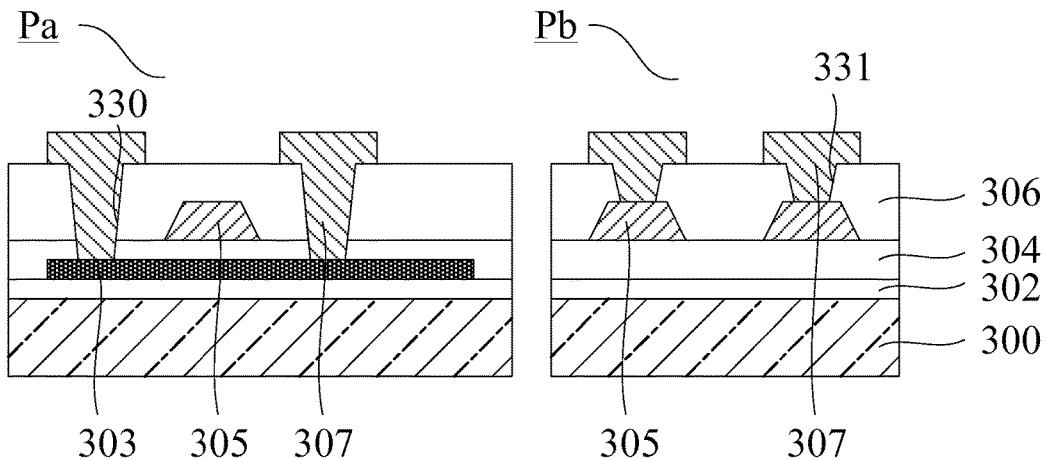
FIGS. 9a-9g illustrate schematic structural diagrams of a flow of fabricating the array substrate in FIG. 7 in sectional views.

Particularly, referring to FIG. 9a, this step includes: forming the source-drain metal layer 307 on the substrate 300 and patterning it, where the source-drain metal layer 307 is the first film layer as referred to in the present embodiment.

More particularly the forming the source-drain metal layer 307 and patterning it includes: preparing the substrate 300; forming the buffer layer 302 on the substrate 300; forming the semiconductor layer 303 on the buffer layer 302 and patterning the semiconductor layer 303; forming the gate insulation layer 304 on the semiconductor layer 303; forming the gate metal layer 305 on the gate insulation layer 304 and patterning the gate metal layer 305; forming the interlayer dielectric layer 306 on the gate metal layer 305 together with the via holes; and forming the source-drain metal layer 307 on the interlayer dielectric layer 306 and patterning the source-drain metal layer 307.

The substrate 300 is prepared. In the present embodiment, the substrate 300 can be a base substrate based upon an inorganic material, such as a glass substrate, a quartz substrate, etc., or can be a substrate made of an organic material.

The buffer layer 302 is formed on the substrate 300. The buffer layer 302 can prevent metal ions in the substrate 300, e.g., aluminum ions, barium ions, sodium ions, etc., from being diffused into an active area of the semiconductor layer 303 in a thermal process and can lower the thermal conductivity. The buffer layer 302 is made of silicon nitride, silicon oxide or a mixture of both. In the present embodiment, the buffer layer 302 is deposited by plasma enhanced chemical vapor deposition. In a practical implementation, a light shielding layer (not illustrated) can be further formed at a location on the substrate 300 corresponding to the semiconductor active area to thereby prevent an influence of backlight on the semiconductor. The light shielding layer is typically made of a very thin metal material and prepared by physical deposition, e.g., sputtering.

The semiconductor layer 303 is formed on the buffer layer 302 and patterned. The semiconductor material can be amorphous silicon, an oxide semiconductor or poly-silicon. The poly-silicon is adopted as the semiconductor material in the present embodiment due to its high electron mobility.

More particularly forming the poly-silicon layer 303 in the present embodiment includes: depositing an amorphous silicon material on one side surface of the substrate 300 and crystallizing the amorphous silicon material to convert the amorphous silicon material into a poly-silicon material. The amorphous silicon material is deposited by plasma enhanced chemical vapor deposition, the deposition thickness being 450 Å. The deposited amorphous silicon material is heated at the thermal temperature of 500° C. to be dehydrogenized. The dehydrogenized amorphous silicon material can be crystallized in an excimer laser crystallization process, a solid phase crystallization process or a rapid thermal annealing process. Due to a very short fusing and crystallization process of a thin film of amorphous silicon in the excimer laser crystallization process and a very low thermal impact on the substrate, an inexpensive glass substrate which is no-resistant to high temperature can be used to thereby lower a fabrication cost. Thus the amorphous silicon material can be crystallized in the excimer laser crystallization process in the present embodiment.

After the amorphous silicon material is crystallized as described above, the poly-silicon material is patterned to form the semiconductor layer 303 in the display area Pa, and to form the semiconductor layer in an area of the peripheral area Pb where the poly-silicon material needs to be reserved, e.g., the transistor area of a gate driving circuit (not illustrated), while all the poly-silicon material in the other area needs to be etched away. A particular patterning process includes: coating a photoresist layer on the poly-silicon material layer and drying the photoresist layer; exposing and developing the photoresist layer, particularly by irradiating the photoresist layer with UV-rays using a mask in a predetermined pattern and removing the photoresist pattern of the irradiated part using alkaline developing solution after exposure, to thereby form the photoresist pattern in the predetermined pattern; etching the poly-silicon material, particularly by dry etching so that a volatile reactant is generated after ion radicals in plasmas are adhered to the surface of the poly-silicon material; and stripping the photoresist, that is, the remaining photoresist is removed using stripping liquid. So far the semiconductor layer 303 is formed. In a practical operation process, the substrate needs to be cleaned and dried to remove impurities on the surface of the substrate before and after each of the steps of coating the photoresist, exposing and developing, etching, stripping, etc.

After the semiconductor layer 303 is formed, channel doping is further performed so that the semiconductor layer 303 is formed with an active area and the source-drain connection area (not illustrated).

The gate insulation layer 304 is formed on the semiconductor layer 303. The gate insulation layer 304 is formed by plasma enhanced chemical vapor deposition. The gate insulation layer 304 can be a monolayer of silicon oxide or a monolayer of silicon nitride, or can be a multilayer structure of silicon oxide/silicon nitride. The gate insulation layer 304 covers the semiconductor layer 303 in the semiconductor layer 303 area, and the gate insulation layer 304 covers the buffer layer 302 in the other area.

The gate metal layer 305 is formed on the gate insulation layer 304 and patterned. Particularly a gate metal material layer is formed on the gate insulation layer 305 by sputtering; a photoresist layer is coated on the gate metal material layer and dried; the photoresist layer is exposed and developed, particularly by irradiating the photoresist layer with UV-rays using a mask in a predetermined pattern and removing the photoresist pattern of the irradiated part using alkaline developing solution after exposure to thereby form the photoresist pattern in the predetermined pattern; the gate metal material is etched, particularly by wet etching so that the gate metal material chemically reacts with etching liquid on the surface of the gate metal material and the gate metal material is consumed gradually as the chemical reaction proceeds constantly until all the gate metal material in the area uncovered by the photoresist is consumed; and the photoresist is stripped, that is, the remaining photoresist is removed using stripping liquid. So far the gate metal layer 305 is formed. The gate metal layer can constitute a gate of a TFT switch component, a common electrode (not illustrated), etc., in the display area Pa, and the gate metal layer 305 can constitute metal wiring, etc., in the peripheral area Pb.

The interlayer dielectric layer 306 together with the via holes is formed on the gate metal layer 305, the via holes 330 are formed in the display area Pa, and the via holes 331 are formed in the peripheral area Pb. The interlayer dielectric layer 306 can be a monolayer of silicon oxide or a monolayer of silicon nitride or can be a dual-layer structure of silicon oxide/silicon nitride. The formation of the interlayer dielectric layer is in the same way that the gate insulation layer 304 is formed, i.e., by plasma enhanced chemical vapor deposition. Reference can be made to the step of forming the gate insulation layer 304 for details thereof, so a repeated description thereof will be omitted here. Forming the via holes in the interlayer dielectric layer 306 includes: forming a photoresist layer on the surface of the interlayer dielectric layer 306; patterning the photoresist layer, particularly including exposure and development processes, where in the exposure process, the photoresist layer is irradiated with UV-rays using a mask in a predetermined pattern, and in the development process, the photoresist pattern of the irradiated part is removed using alkaline developing solution after the exposure process, to thereby form the photoresist pattern in the pattern of the via holes; etching the interlayer dielectric layer 306 to form the interlayer dielectric layer 306 with the via holes; and removing the remaining photoresist layer.

The source-drain metal layer 307 is formed on the interlayer dielectric layer 306 and patterned. A source-drain metal layer material is deposited on the interlayer dielectric layer 306 so that the source-drain metal layer 307 covers the entire surface of the substrate 300. The source-drain metal layer 307 is formed by physical deposition, particularly by sputtering, i.e., bombarding a target to transfer the film material from the target onto the substrate. The source-drain metal layer 307 is electrically connected with the semiconductor layer 303 through the via holes 330 formed in the step described above in the display area Pa; and the source-drain metal layer 307 is electrically connected with the gate metal layer 305 through the via holes 331 formed in the step described above in the peripheral area Pb. The source-drain metal layer 307 is patterned in the same particular steps as that the gate metal layer 305 is patterned, so a repeated description thereof will be omitted here.

Further referring to FIG. 9, the step is performed: forming an insulation layer on the first film layer, wherein the insulation layer covers the first film layer and the substrate.

Figure 9B:
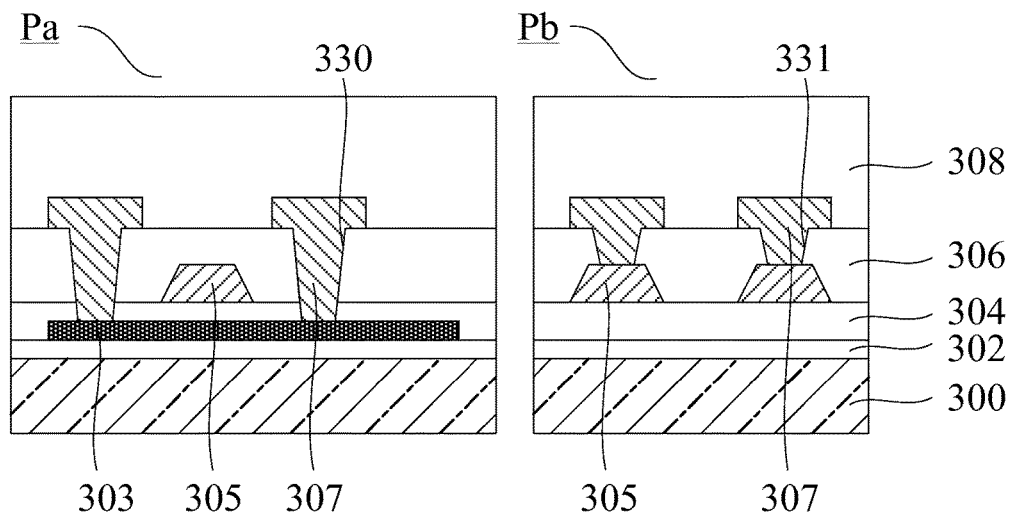

Particularly, referring to FIG. 9b, the step includes: forming the passivation layer 308 on the source-drain metal layer 307 so that the passivation layer 308 covers the source-drain metal layer 307 and the substrate 300. The passivation layer 308 is the insulation layer as referred to in the present embodiment.

The passivation layer 308 can be a monolayer of an organic passivation layer or an inorganic passivation layer or can be a multilayer of a silicon nitride/silicon oxide film and an organic passivation layer film/inorganic passivation layer film. The passivation layer 308 is formed by plasma enhanced chemical vapor deposition.

Further referring to FIG. 9, the step is performed: forming an electrostatic charge dispersion layer on the insulation layer.

Figure 9C:
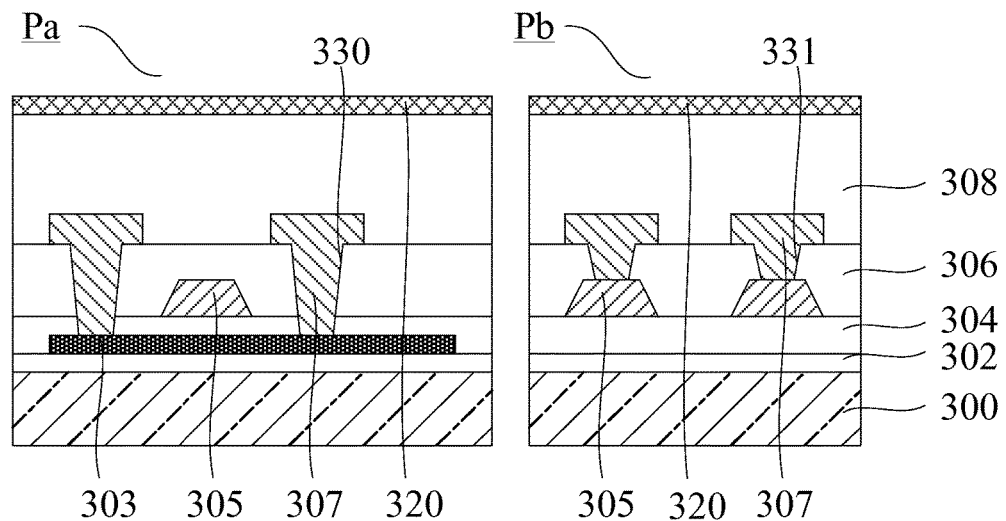

As illustrated in FIG. 9c, the step includes: forming the electrostatic charge dispersion layer 320 on the passivation layer 308 so that the electrostatic charge dispersion layer 320 covers the entire surface of the substrate 300. The electrostatic charge dispersion layer 320 is formed by physical deposition, particularly by sputtering, i.e., bombarding a target to transfer the film material from the target onto the substrate. The material of the electrostatic charge dispersion layer 320 is indium tin oxide or indium zinc oxide, which has a high electrical conductivity and has no any influence upon transmittance. In a subsequent process, the electrostatic charge dispersion layer 320 can achieve a function of electrostatic protection on the source-drain metal layer 307 and the semiconductor layer 303 below the electrostatic charge dispersion layer 320. In the present embodiment, the electrostatic charge dispersion layer 320 is made of indium tin oxide. The film thickness d of the electrostatic charge dispersion layer 320 ranges from 5 nm to 500 nm, so that better electrostatic protection can be achieved while the cost is controlled and a lower resistivity is maintained.

Further referring to FIG. 9, the step is performed: forming via holes in the insulation layer and the electrostatic charge dispersion layer so that the electrostatic charge dispersion layer covers the insulation layer other than the area of the via holes.

Figure 9D:
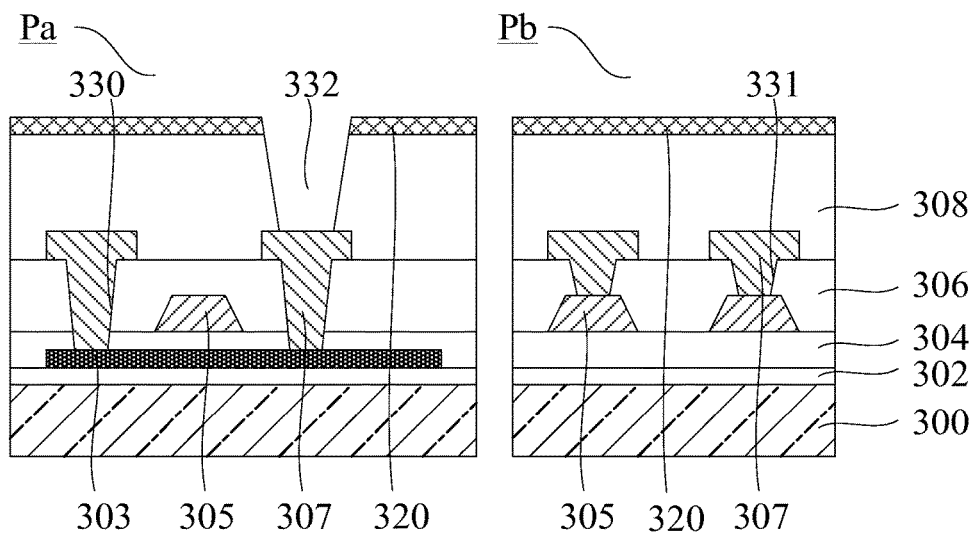

As illustrated in FIG. 9d, the via holes 332 are formed in the electrostatic charge dispersion layer 320 and the passivation layer 308 in the display area Pa so that the electrostatic charge dispersion layer 320 covers the passivation layer 308 other than the area of the via holes 332; and no via holes are formed in the peripheral area Pb.

Particularly the forming the via holes 332 in the electrostatic charge dispersion layer 320 and the insulation layer, i.e., the passivation layer 308, includes: forming a photoresist layer on the surface of the electrostatic charge dispersion layer 320; patterning the photoresist layer, particularly including exposure and development processes, where in the exposure process, the photoresist layer is irradiated with UV-rays using a mask in a predetermined pattern, and in the development process, the photoresist pattern of the irradiated part is removed using alkaline developing solution after the exposure process to thereby form the photoresist pattern in the predetermined pattern; etching the electrostatic charge dispersion layer 320 and the insulation layer, i.e., the passivation layer 308, to form the electrostatic charge dispersion layer and the passivation layer 308 with the via holes; and removing the remaining photoresist layer.

More particularly the step of etching the electrostatic charge dispersion layer 320 and the passivation layer 308 includes: etching the electrostatic charge dispersion layer 320 so that the electrostatic charge dispersion layer 320 is inclined at the edges of the via holes 332 at an angle θ (not illustrated) ranging from 0° to 90° and preferably 30° to 60°; and etching the insulation layer.

Cleaning and drying can be further performed after the photoresist is stripped to remove impurities on the surface of the substrate 300.

The substrate may be susceptible to electrostatic charges in the course of forming the via holes, in the course of stripping the photoresist and cleaning and drying after the via holes are formed, and in the course of transporting the substrate. The electrostatic charges primarily arise from the following three aspects: frictional electrification including friction with the air, friction of the glass substrate with a brush and friction of the glass substrate with a base during transportation, washing friction with pure water during cleaning, friction of an air blade with the air, etc.; contact and separation electrification including separation of the glass substrate after coming into contact with the base, plasmas bombard, ion bombard, contact with agent liquid; and inductive electrification, e.g., electrostatic charges inductively generated in proximity to a charged object. The electrostatic charges may be easily released after being accumulated to some extent. Since the surface of the substrate is covered with the electrostatic charge dispersion layer 320 throughout the formation of the via holes, the electrostatic charges accumulated on the semiconductor layer 303 and the source-drain metal layer 307 can be released onto the surface of the electrostatic charge dispersion layer 320 by surface leakage over the high resistance of the air or otherwise without incurring any electrostatic damage to the semiconductor layer 303 and the source-drain metal layer 307.

Further referring to FIG. 9, the step is performed: forming a second film layer on the electrostatic charge dispersion layer, the second film layer being electrically connected with the first film layer through the via holes.

Figure 9E:
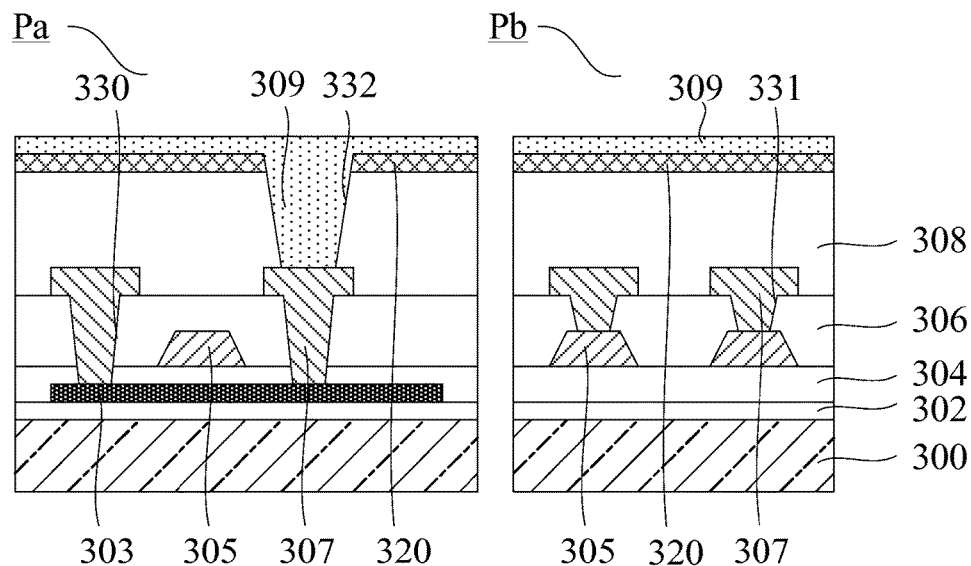

As illustrated in FIG. 9e, the first transparent electrode layer 309 is formed on the electrostatic charge dispersion layer 320 so that the first transparent electrode layer 309 covers the entire surface of the substrate 300. The first transparent electrode layer 309 is electrically connected with the source-drain metal layer 307 through the via holes 332 formed in the step descried above in the display area Pa. The second film layer as referred to in the present embodiment is the first transparent electrode layer 309. The first transparent electrode layer 309 is formed by physical deposition, particularly by sputtering, i.e., bombarding a target to transfer the film material from the target onto the substrate. The target can be indium tin oxide or indium zinc oxide.

Further referring to FIG. 9, the step is performed: patterning the second film layer and the electrostatic charge dispersion layer so that the electrostatic charge dispersion layer is in the same profile as the second film layer.

Figure 9F:
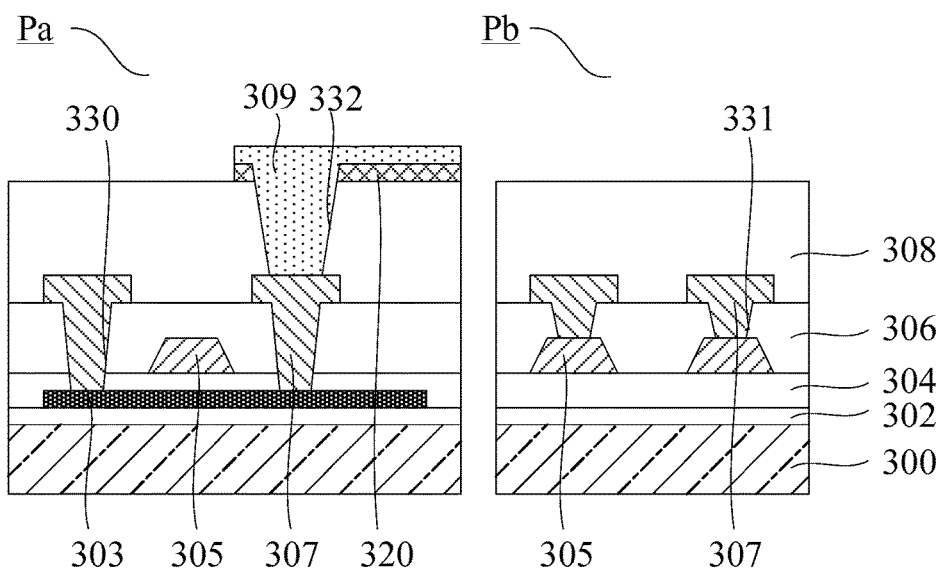

As illustrated in FIG. 9f, the first transparent electrode layer 309 and the electrostatic charge dispersion layer 320 are patterned so that the electrostatic charge dispersion layer 320 is in the same profile as the first transparent electrode layer 309.

Particularly a photoresist layer is formed on the surface of the second film layer, i.e., the first transparent electrode layer 309; the photoresist layer is patterned, particularly including exposure and development processes, where the exposure and development processes are the same as the exposure and development processes of the photoresist in the step described above, so a repeated description thereof will be omitted here; the second film layer, i.e., the first transparent electrode layer 309, and the electrostatic charge dispersion layer 320 are etched so that the electrostatic charge dispersion layer 320 is in the same profile as the first transparent electrode layer 309; and the remaining photoresist layer is removed. Since both the first transparent electrode layer 309 and the electrostatic charge dispersion layer 320 are transparent conducting oxide materials, the first transparent electrode layer 309 and the electrostatic charge dispersion layer 320 can be etched in the same process step. With wet etching, the materials, of the first transparent electrode layer 309 and electrostatic charge dispersion layer 320 in the areas uncovered by the photoresist, chemically react with etching liquid on the surfaces of the materials, and the materials are consumed gradually as the chemical reaction proceeds constantly until all the first transparent electrode material and the electrostatic charge dispersion layer material in the areas uncovered by the photoresist are consumed so that the first transparent electrode layer 309 is in the same profile as the electrostatic charge dispersion layer 320.

The electrostatic charge dispersion layer 320 directly contacts with the first transparent electrode layer 309 so that the resistivity of the first transparent electrode layer 309 can be lowered, to thereby improve delay attenuation of a display signal over the first transparent electrode layer thus enhancing a display quality.

Figure 9G:
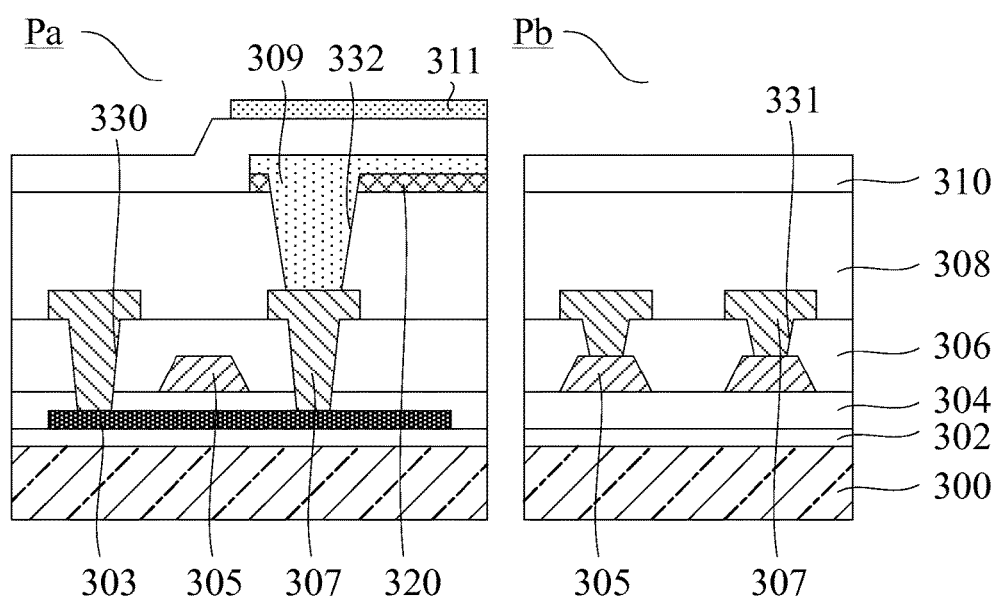

Furthermore, referring to FIG. 9g, after the first transparent electrode layer 309 and the electrostatic charge dispersion layer 320 are patterned, the interlayer insulation layer 310 and the second transparent electrode layer 311 are formed in order on the first transparent electrode layer 309.

In the method of fabricating an array substrate according to the present embodiment, the electrostatic charge dispersion layer is formed in the fabrication process so that accumulation of electrostatic charges on the array substrate in the fabrication process of the substrate can be lowered, and the source-drain metal layer is electrically connected with the semiconductor layer in the display area so that the charges accumulated on the semiconductor layer and the source-drain metal layer can be released onto the surface of the electrostatic charge dispersion layer through surface leakage to thereby lower a damage of the electrostatic charges to the semiconductor layer so as to improve the stability and the uniformity of the TFT devices, avoid the TFT devices from being struck or damaged by the electrostatic charges to consequentially come with electrical drifting, and eliminate various electrostatic Muras. Moreover the electrostatic charge dispersion layer directly contacts with the first transparent electrode layer so that the resistivity of the first transparent electrode layer can be lowered to thereby improve delay attenuation of a display signal over the first transparent electrode layer thus enhancing a display quality. Moreover the electrostatic charge dispersion layer can be patterned using the same mask as the first transparent electrode layer without any addition process step.

Figure 10:
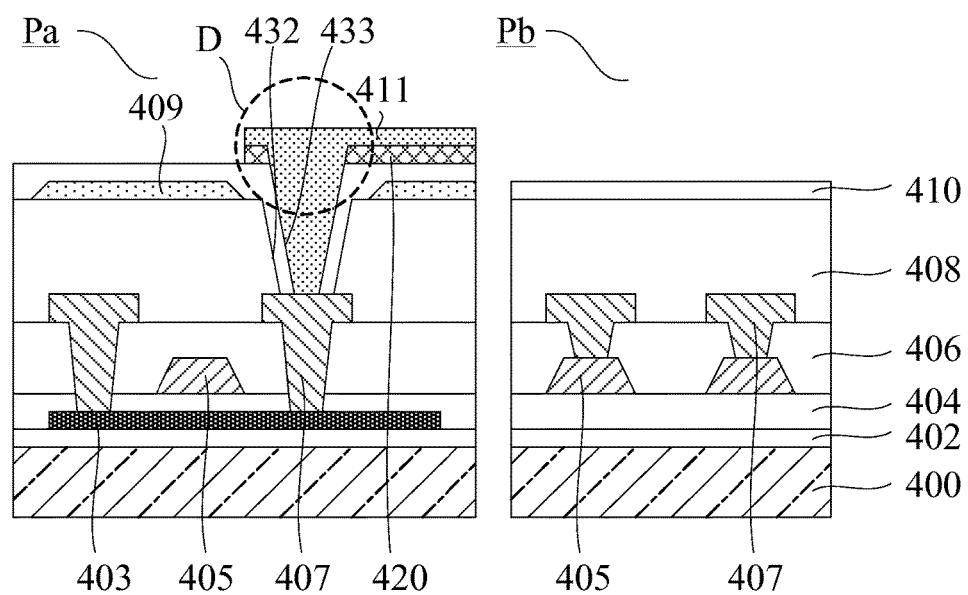
FIG. 10 illustrates a schematic structural diagram of a further array substrate according to another embodiment of the present invention in a sectional view.

FIG. 10 illustrates a schematic structural diagram of a further array substrate according to an embodiment of the invention in a sectional view, where Pa represents a display area of the array substrate, and Pb represents a peripheral area of the array substrate.

Referring to FIG. 10, the array substrate includes: a substrate 400, and a first film layer, an insulation layer, an electrostatic charge dispersion layer 420 and a second film layer arranged in order on one side surface of the substrate 400, where the insulation layer and the electrostatic charge dispersion layer are provided with via holes, and the second film layer is electrically connected with the first film layer through the via holes; and the electrostatic charge dispersion layer 420 is in the same profile as the second film layer. In the present embodiment, the first film layer is a source-drain metal layer 407, the insulation layer is an interlayer insulation layer 410, and the second film layer is a second transparent electrode layer 411. Stated otherwise, in the present embodiment, the source-drain metal layer 407, a passivation layer 408, a first transparent electrode layer 409, the interlayer insulation layer 410, the electrostatic charge dispersion layer 420 and the second transparent electrode layer 411 are formed in order on the substrate 400; the interlayer insulation layer 410 and the electrostatic charge dispersion layer 420 are provided thereon with the via holes 433, and the second transparent electrode layer 411 is electrically connected with the source-drain metal layer 407 through the via holes 433; and the electrostatic charge dispersion layer 420 is in the same profile as the second transparent electrode layer 411.

More particularly, further referring to FIG. 10, the array substrate according to the present embodiment further includes the substrate 400, a buffer layer 402, a semiconductor layer 403, a gate insulation layer 404, a gate metal layer 405, an interlayer dielectric layer 406 and the source-drain metal layer 407. Referring to FIG. 10 together with FIG. 7, the substrate 400, the buffer layer 402, the semiconductor layer 403, the gate insulation layer 404, the gate metal layer 405, the interlayer dielectric layer 406 and the source-drain metal layer 407 in the present embodiment are structurally the same as the substrate 300, the buffer layer 302, the semiconductor layer 303, the gate insulation layer 304, the gate metal layer 305, the interlayer dielectric layer 306 and the source-drain metal layer 307 in the other present embodiment of the invention, and reference can be made to the other embodiment for particular structures thereof, so a repeated description thereof will be omitted here. Particularly those differences of the present embodiment from the other embodiment will be described.

Further referring to FIG. 10, the passivation layer 408 is formed on the source-drain metal layer 407. The passivation layer 408 can be a monolayer of an organic passivation layer or an inorganic passivation layer or can be a multilayer of a silicon nitride/silicon oxide film and an organic passivation layer film/inorganic passivation layer film. Moreover the passivation layer 408 is provided with via holes 432 in a drain area formed by the source-drain metal layer 407 in the display area Pa.

The first transparent electrode layer 409 is formed on the passivation layer 408. The first transparent electrode layer is made of indium tin oxide or indium zinc oxide, and the first transparent electrode layer 409 partially covers the passivation layer 408.

The interlayer insulation layer 410 is formed on the first transparent electrode layer 409. The interlayer insulation layer 410 is made of one or two of silicon oxide, silicon nitride and silicon oxynitride and preferably silicon nitride. The interlayer insulation layer 410 covers the parts of the vials 432 in the passivation layer 408 and the other area of the substrate 400.

The electrostatic charge dispersion layer 420 is formed on the interlayer insulation layer 410. The material of the electrostatic charge dispersion layer 420 is indium tin oxide or indium zinc oxide which has a high electrical conductivity and has no any influence upon transmittance. The electrostatic charge dispersion layer 420 can achieve a function of electrostatic protection on the source-drain metal layer 407 and the semiconductor layer 403 below the electrostatic charge dispersion layer 420 after the electrostatic charge dispersion layer 420 is formed until the second transparent electrode layer 411 is formed. Moreover the film thickness d of the electrostatic charge dispersion layer 420 ranges from 5 nm to 500 nm, so that better electrostatic protection can be achieved while the cost is controlled and a lower resistivity is maintained. Moreover the electrostatic charge dispersion layer 420 and the interlayer insulation layer 410 are provided with the via holes 433 in the drain area formed by the source-drain metal layer 407 in the display area Pa.

The second transparent electrode layer 411 is formed on the electrostatic charge dispersion layer 420. The second transparent electrode layer 411 is electrically connected with the source-drain metal layer 407 through the via holes 433 of the interlayer insulation layer 410 and the electrostatic charge dispersion layer 420 in the display area Pa. Moreover the electrostatic charge dispersion layer 420 is in the same profile as the second transparent electrode layer 411. The profiles of the electrostatic charge dispersion layer 420 and the second transparent electrode layer 411 can be formed in the same process step in the preparation process without any addition process.

Figure 11:
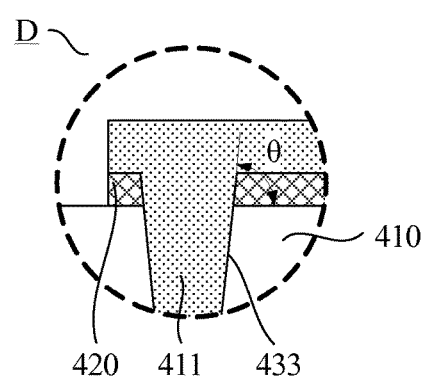
FIG. 11 illustrates a schematic enlarged diagram of the region D in FIG. 10.

More particularly, FIG. 11 illustrates a schematic enlarged diagram of the region D in FIG. 10. Referring to FIG. 10 and FIG. 11, the electrostatic charge dispersion layer 420 and the second transparent electrode layer 411 are formed in order on the interlayer insulation layer 410, and the electrostatic charge dispersion layer 420 and the interlayer insulation layer 410 are provided with the via holes 433. The electrostatic charge dispersion layer 420 is inclined at the via holes 433 at an angle θ ranging from 0° to 90° and preferably 30° to 60°. Due to the inclination angle of the electrostatic charge dispersion layer here, electrostatic charges accumulated on the substrate can be more easily discharged on the electrostatic charge dispersion layer 420 by surface leakage, etc., to thereby achieve a better electrostatic protection effect.

The array substrate according to the present embodiment includes the electrostatic charge dispersion layer so that accumulation of electrostatic charges on the array substrate in the fabrication process of the substrate can be lowered, and the source-drain metal layer is electrically connected with the semiconductor layer in the display area so that the charges accumulated on the semiconductor layer and the source-drain metal layer can be released onto the surface of the electrostatic charge dispersion layer by surface leakage to thereby lower a damage of the electrostatic charges to the semiconductor layer thus improving the stability and the uniformity of the TFT devices, avoiding the TFT devices from being struck or damaged by the electrostatic charges to consequentially come with electrical drifting, and eliminating various electrostatic Muras. Moreover the electrostatic charge dispersion layer directly contacts with the second transparent electrode layer so that the resistivity of the second transparent electrode layer can be lowered to thereby improve a display quality.

FIG. 12 illustrates schematic structural diagrams of a flow of fabricating the array substrate in FIG. 10 in sectional views.

Referring to FIG. 12, the step is performed: preparing a substrate and forming a first film layer on one side surface of the substrate.

Figure 12A:
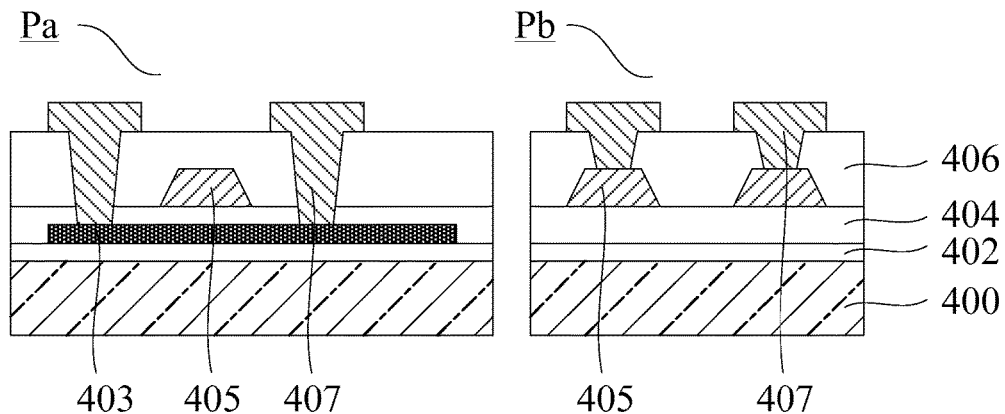
FIGS. 12a-12f illustrate schematic structural diagrams of a flow of fabricating the array substrate in FIG. 10 in sectional views.

Particularly, referring to FIG. 12a, this step includes: forming the source-drain metal layer 407 on the substrate 400 and patterning it. The source-drain metal layer 407 is the first film layer as referred to in the present embodiment.

More particularly, referring to FIG. 12a together with FIG. 9a, the first film layer is formed on one side surface of the substrate in the present embodiment in the same step as the step of forming the first film layer in the other embodiment of the invention, and reference can be made to the step of forming the first film layer in the other embodiment of the invention for details thereof, so a repeated description thereof will be omitted here.

Further referring to FIG. 12, the step is performed: forming an insulation layer on the first film layer so that the insulation layer covers the first film layer and the substrate.

Figure 12B:
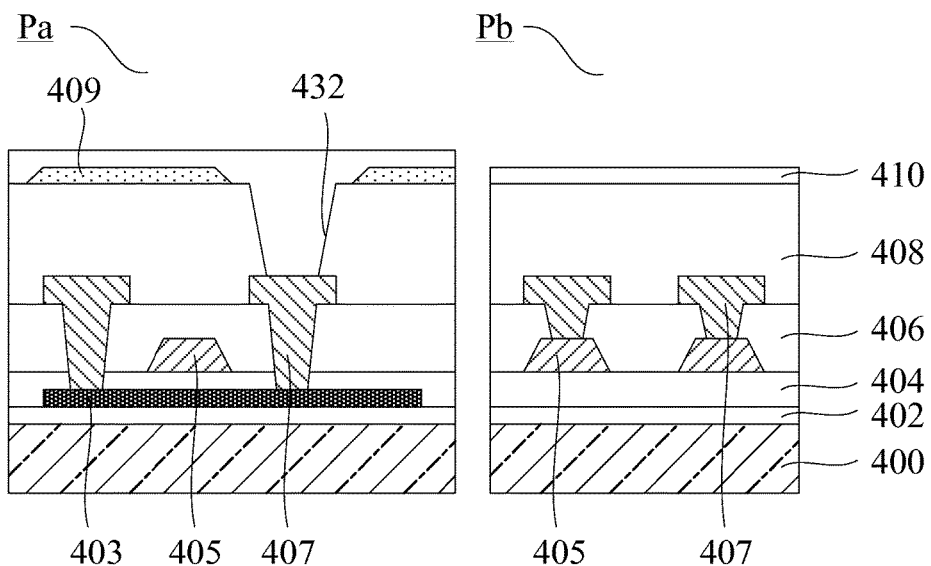

Particularly, referring to FIG. 12b, the step includes: forming the passivation layer 408 on the source-drain metal layer 407 and patterning the passivation layer; forming the first transparent electrode layer 409 on the passivation layer 408 and patterning the first transparent electrode layer 409, and forming the interlayer insulation layer 410 on the first transparent electrode layer 409. The interlayer insulation layer 410 is the insulation layer as referred to in the present embodiment.

The passivation layer 408 is formed on the source-drain metal layer 407 and patterned. The passivation layer 408 can be a monolayer of an organic passivation layer or an inorganic passivation layer or can be a multilayer of a silicon nitride film/silicon oxide film and an organic passivation layer film/inorganic passivation layer film. The passivation layer 408 is formed by plasma enhanced chemical vapor deposition. The passivation layer 408 is patterned, that is, the via holes 433 are formed in the passivation layer at the locations corresponding to drains formed by the source-drain metal layer 407. The forming the via holes 433 includes: forming a photoresist layer on the surface of the passivation layer 408; patterning the photoresist layer, particularly including exposure and development; etching the passivation layer 408 to form the predetermined via holes; and removing the remaining photoresist layer.

The first transparent electrode layer 409 is formed on the passivation layer 408 and patterned. The first transparent electrode layer 409 is formed on the passivation layer 408 by physical deposition so that the first transparent electrode layer 409 covers the entire surface of the substrate 400, particularly forming the first transparent electrode layer 409 by sputtering, i.e., bombarding a target to transfer the film material from the target onto the substrate, where the adopted target is indium tin oxide or indium zinc oxide. The patterning the first transparent electrode layer 409 includes: forming a photoresist layer on the surface of the first transparent electrode layer 409; patterning the photoresist layer, particularly including exposure and development; etching the first transparent electrode layer 409 to form a predetermined pattern; and removing the remaining photoresist layer.

The interlayer insulation layer 410 is formed on the first transparent electrode layer 409. The interlayer insulation layer 410 can be a monolayer of an organic passivation layer or an inorganic passivation layer or can be a multilayer of a silicon nitride film/silicon oxide film and an organic passivation layer film/inorganic passivation layer film. The interlayer insulation layer 410 is formed by plasma enhanced chemical vapor deposition.

Further referring to FIG. 12, the step is performed: forming an electrostatic charge dispersion layer on the insulation layer.

Figure 12C:
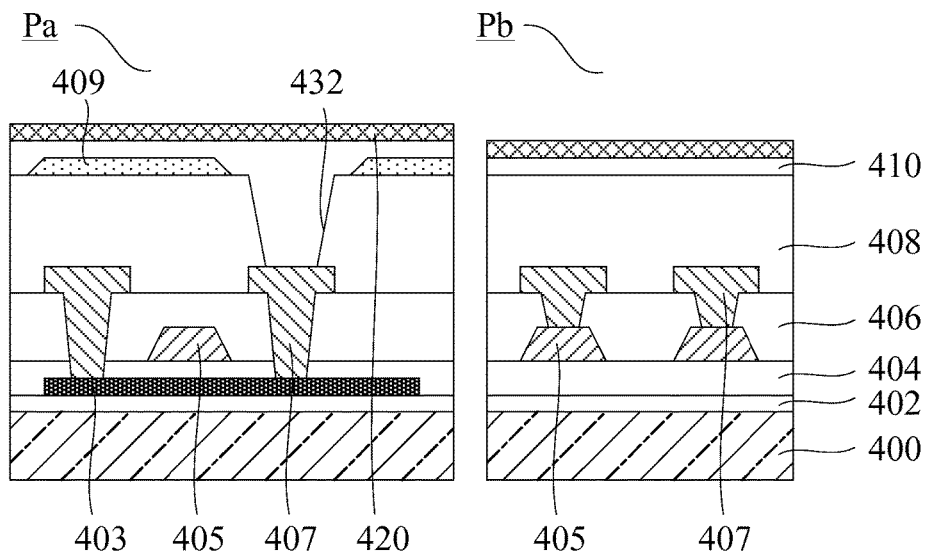

As illustrated in FIG. 12c, the step includes: forming the electrostatic charge dispersion layer 420 on the interlayer insulation layer 410 so that the electrostatic charge dispersion layer 420 covers the entire surface of the substrate 400. The electrostatic charge dispersion layer 420 is formed by physical deposition, particularly by sputtering, i.e., bombarding a target to transfer the film material from the target onto the substrate. The material of the electrostatic charge dispersion layer 420 is indium tin oxide or indium zinc oxide, and such materials have a high electrical conductivity and have no any influence upon transmittance. In a subsequent process, the electrostatic charge dispersion layer 420 can achieve a function of electrostatic protection on the source-drain metal layer 407 and the semiconductor layer 403 below the electrostatic charge dispersion layer 420. In the present embodiment, the electrostatic charge dispersion layer 420 is made of indium tin oxide. The film thickness d of the electrostatic charge dispersion layer 420 ranges from 5 nm to 500 nm, so that better electrostatic protection can be achieved while the cost is controlled and a lower resistivity is maintained.

Further referring to FIG. 12, the step is performed: forming via holes in the insulation layer and the electrostatic charge dispersion layer so that the electrostatic charge dispersion layer covers the insulation layer other than the area of the via holes.

Figure 12D:
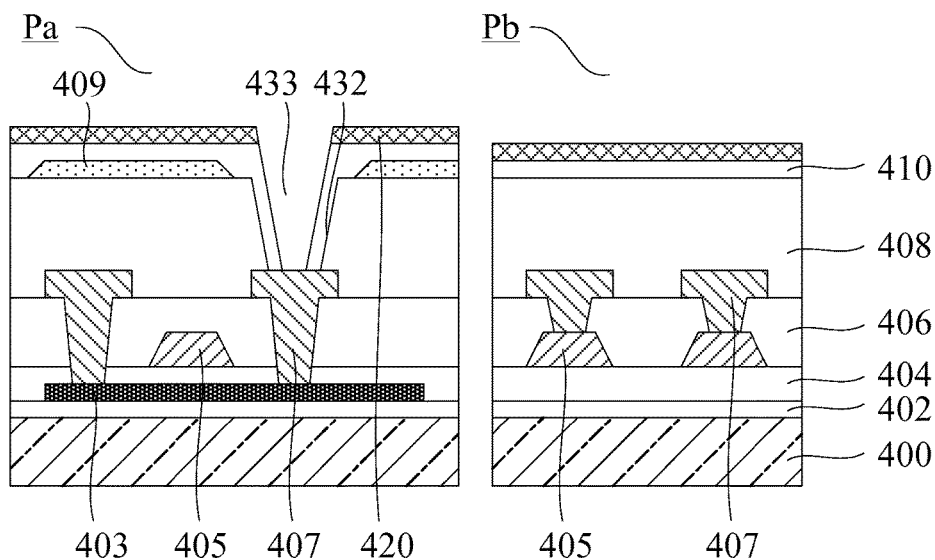

As illustrated in FIG. 12d, the via holes 433 are formed in the electrostatic charge dispersion layer 420 and the interlayer insulation layer 410 in the display area Pa at the location of drain electrode formed by the source-drain metal layer 407 so that the electrostatic charge dispersion layer 420 covers the interlayer insulation layer 410 other than the area of the via holes; and no via holes are formed in the peripheral area Pb.

Particularly the step of the forming the via holes 433 in the electrostatic charge dispersion layer 420 and the insulation layer, i.e., the interlayer insulation layer 410, includes: forming a photoresist layer on the surface of the electrostatic charge dispersion layer 420; patterning the photoresist layer, particularly including exposure and development processes, where in the exposure process, the photoresist layer is irradiated with UV-rays using a mask in a predetermined pattern, and in the development process, the photoresist pattern of the irradiated part is removed using alkaline developing solution after the exposure process, to thereby form the photoresist pattern in the predetermined pattern; etching the electrostatic charge dispersion layer 420 and the insulation layer, i.e., the interlayer insulation layer 410, to form the electrostatic charge dispersion layer 420 and the insulation layer, i.e., the interlayer insulation layer 410, with the via holes; and removing the remaining photoresist layer.

More particularly the step of etching the electrostatic charge dispersion layer 420 and the interlayer insulation layer 410 includes: etching the electrostatic charge dispersion layer 420 so that the electrostatic charge dispersion layer is inclined at the edges of the via holes at an angle θ (not illustrated) ranging from 0° to 90° and preferably 30° to 60°; and etching the interlayer insulation layer 410.

Cleaning and drying can be further performed after the photoresist is stripped to remove impurities on the surface of the substrate 400.

The substrate may be susceptible to electrostatic charges in the course of forming the via holes 433, in the course of stripping the photoresist and cleaning and drying after the via holes 433 are formed, and in the course of transporting the substrate. The electrostatic charges primarily arise from the following three aspects: frictional electrification including friction with the air, friction of the glass substrate with a brush and friction of the glass substrate with a base during transportation, washing friction with pure water during cleaning, friction of an air blade with the air, etc.; contact and separation electrification including separation of the glass substrate after coming into contact with the base, plasmas bombard, ion bombard, contact with agent liquid; and inductive electrification, e.g., electrostatic charges inductively generated in proximity to a charged object. The electrostatic charges may be easily released after being accumulated to some extent. Since the surface of the substrate is covered with the electrostatic charge dispersion layer 420 throughout the formation of the via holes, the electrostatic charges accumulated on the semiconductor layer 403 and the source-drain metal layer 407 can be released onto the surface of the electrostatic charge dispersion layer 420 through surface leakage over the high resistance of the air or otherwise without incurring any electrostatic damage to the semiconductor layer 403 and the source-drain metal layer.

Further referring to FIG. 12, the step is performed: forming a second film layer on the electrostatic charge dispersion layer so that the second film layer is electrically connected with the first film layer through the via holes.

Figure 12E:
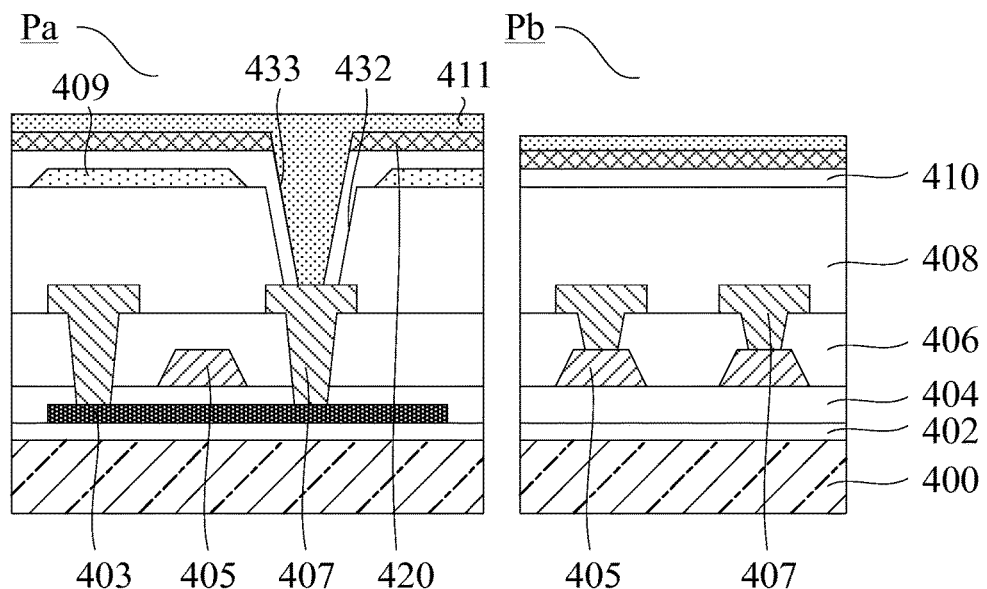

As illustrated in FIG. 12e, the second transparent electrode layer 411 is formed on the electrostatic charge dispersion layer 420 so that the second transparent electrode layer 411 covers the entire surface of the substrate 400. The second transparent electrode layer 411 is electrically connected with the source-drain metal layer 407 through the via holes 433 formed in the step descried above in the display area Pa. The second film layer as referred to in the present embodiment is the second transparent electrode layer 411. The second transparent electrode layer 411 is formed by physical deposition, particularly by sputtering, i.e., bombarding a target to transfer the film material from the target onto the substrate.

Further referring to FIG. 12, the step is performed: patterning the second film layer and the electrostatic charge dispersion layer so that the electrostatic charge dispersion layer is in the same profile as the second film layer.

Figure 12F:
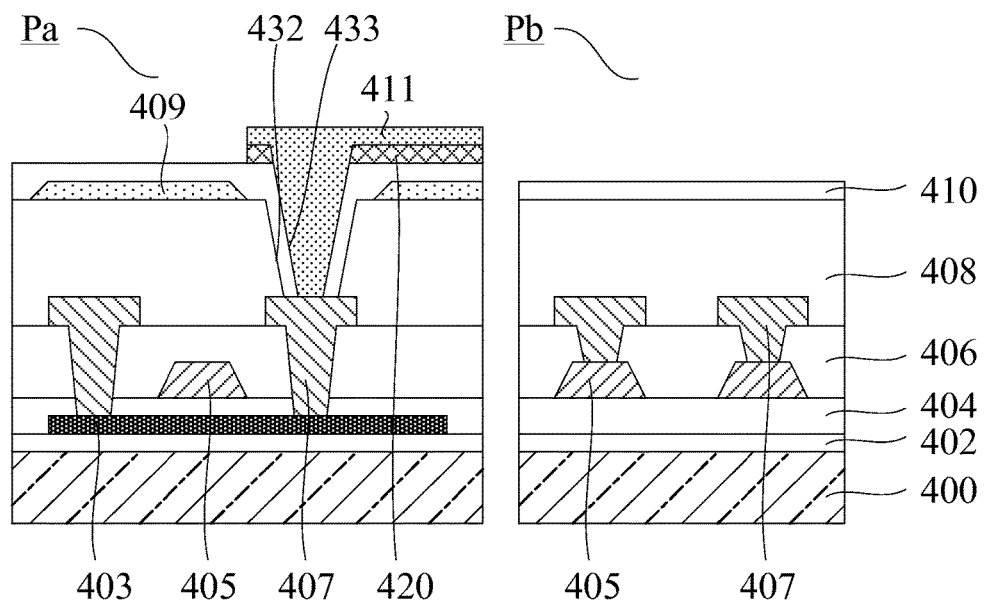

As illustrated in FIG. 12f, the second transparent electrode layer 411 and the electrostatic charge dispersion layer 420 are patterned so that the electrostatic charge dispersion layer 420 is in the same profile as the second transparent electrode layer 411.

Particularly a photoresist layer is formed on the surface of the second film layer, i.e., the second transparent electrode layer 411; the photoresist layer is patterned in the same process as the process in which the photoresist is patterned in the step descried above, so a repeated description thereof will be omitted here; the second film layer, i.e., the second transparent electrode layer 411, and the electrostatic charge dispersion layer 420 are etched so that the electrostatic charge dispersion layer 420 is in the same profile as the second transparent electrode layer 411; and the remaining photoresist layer is removed. Since both the second transparent electrode layer 411 and the electrostatic charge dispersion layer 420 are transparent conducting oxide materials, the second transparent electrode layer 411 and the electrostatic charge dispersion layer 420 can be etched in the same process step. With wet etching, the materials of the second transparent electrode layer 411 and electrostatic charge dispersion layer 420 in the areas uncovered by the photoresist chemically react with etching liquid on the surfaces of the materials, and the materials are consumed gradually as the chemical reaction proceeds constantly until all the second transparent electrode material and the electrostatic charge dispersion layer material in the areas uncovered by the photoresist are consumed so that the second transparent electrode layer 411 is in the same profile as the electrostatic charge dispersion layer 420.

The electrostatic charge dispersion layer 420 directly contacts with the second transparent electrode layer 411 so that the resistivity of the second transparent electrode layer 411 can be lowered to thereby improve delay attenuation of a display signal over the second transparent electrode layer thus enhancing a display quality.

In the method of fabricating an array substrate according to the present embodiment, the electrostatic charge dispersion layer is formed in the fabrication process, so that accumulation of electrostatic charges on the array substrate in the fabrication process of the substrate can be lowered, and the source-drain metal layer is electrically connected with the semiconductor layer in the display area so that the charges accumulated on the semiconductor layer and the source-drain metal layer can be released onto the surface of the electrostatic charge dispersion layer through surface leakage to thereby lower a damage of the electrostatic charges to the semiconductor layer thus improving the stability and the uniformity of the TFT devices, avoiding the TFT devices from being struck or damaged by the electrostatic charges to consequentially come with electrical drifting, and eliminating various electrostatic Muras. Moreover the electrostatic charge dispersion layer directly contacts with the second transparent electrode layer so that the resistivity of the second transparent electrode layer can be lowered to thereby improve delay attenuation of a display signal over the second transparent electrode layer thus enhancing a display quality. Moreover the electrostatic charge dispersion layer can be patterned using the same mask as the second transparent electrode layer without any addition process step.

Figure 13:
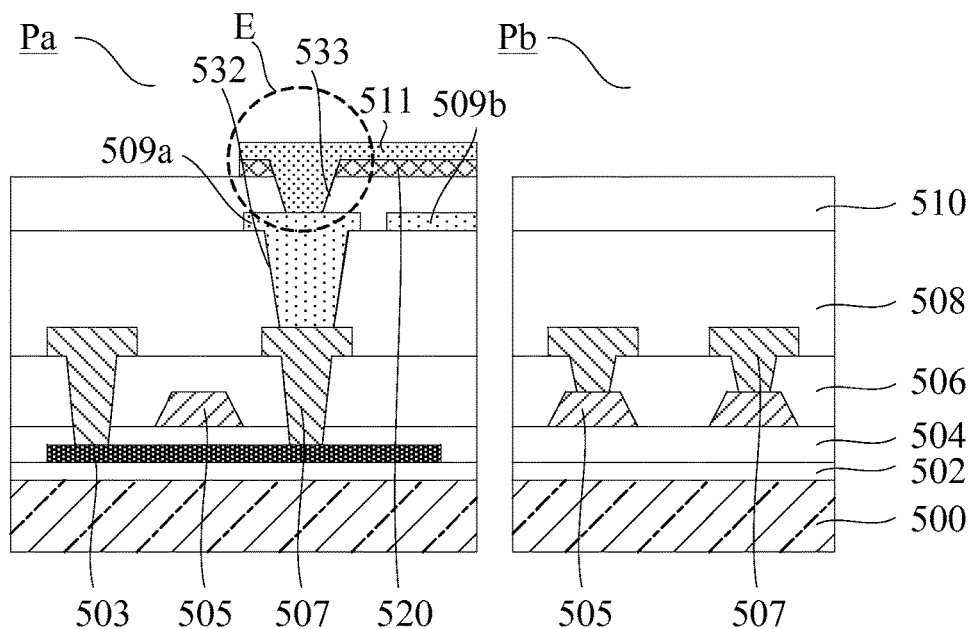
FIG. 13 illustrates a schematic structural diagram of a further array substrate according to another embodiment of the present invention in a sectional view.

FIG. 13 illustrates a schematic structural diagram of a further array substrate according to an embodiment of the invention in a sectional view, where Pa represents a display area of the array substrate, and Pb represents a peripheral area of the array substrate.

Referring to FIG. 13, the array substrate includes: a substrate 500, and a first film layer, an insulation layer, an electrostatic charge dispersion layer 520 and a second film layer arranged in order on one side surface of the substrate 500, where the insulation layer and the electrostatic charge dispersion layer are provided with via holes, and the second film layer is electrically connected with the first film layer through the via holes; and the electrostatic charge dispersion layer 520 is in the same profile as the second film layer. In the present embodiment, the first film layer is a first transparent electrode layer 509, the insulation layer is an interlayer insulation layer 510, and the second film layer is a second transparent electrode layer 511. Stated otherwise, in the present embodiment, the first transparent electrode layer 509, the interlayer insulation layer 510, the electrostatic charge dispersion layer 520 and the second transparent electrode layer 511 are formed in order on the substrate 500; the interlayer insulation layer 510 and the electrostatic charge dispersion layer 520 are provided thereon with the via holes 533, and the second transparent electrode layer 511 is electrically connected with the first transparent electrode layer 509 through the via holes 533; and the electrostatic charge dispersion layer 520 is in the same profile as the second transparent electrode layer 511.

More particularly, further referring to FIG. 13, the array substrate according to the present embodiment further includes the substrate 500, a buffer layer 502, a semiconductor layer 503, a gate insulation layer 504, a gate metal layer 505, an interlayer dielectric layer 506 and a source-drain metal layer 507. Referring to FIG. 13 together with FIG. 7, the substrate 500, the buffer layer 502, the semiconductor layer 503, the gate insulation layer 504, the gate metal layer 505, the interlayer dielectric layer 506 and the source-drain metal layer 507 in the present embodiment are structurally the same as the substrate 300, the buffer layer 302, the semiconductor layer 303, the gate insulation layer 304, the gate metal layer 305, the interlayer dielectric layer 306 and the source-drain metal layer 307 in the other present embodiment of the invention, and reference can be made to the other embodiment for particular structures thereof, so a repeated description thereof will be omitted here. Particularly those differences of the present embodiment from the other embodiment will be described.

Further referring to FIG. 13, a passivation layer 508 is formed on the source-drain metal layer 507. The passivation layer 508 can be a monolayer of an organic passivation layer or an inorganic passivation layer or can be a multilayer of a silicon nitride/silicon oxide film and an organic passivation layer film/inorganic passivation layer film. Moreover the passivation layer 508 is provided with via holes 532 in drain areas formed by the source-drain metal layer 507 in the display area Pa.

The first transparent electrode layer 509, i.e., the first film layer as referred to in the present embodiment, is formed on the passivation layer 508. The first transparent electrode layer 509 is made of indium tin oxide or indium zinc oxide, and the first transparent electrode layer 509 partially covers the passivation layer 508. Moreover the first transparent electrode layer 509 further includes a connection section 509a and an electrode section 509b, wherein the connection section 509a and the electrode section 509b are separated from each other. The connection section 509a is electrically connected with the source-drain metal layer 507 through the via holes 532 in the passivation layer 508 described above.

The interlayer insulation layer 510, i.e., the insulation layer as referred to in the present embodiment, is formed on the first transparent electrode layer 509. The interlayer insulation layer 510 is made of one or two of silicon oxide, silicon nitride and silicon oxynitride and preferably silicon nitride. The interlayer insulation layer 510 covers the first transparent electrode layer 509 and the other area of the substrate 500.

The electrostatic charge dispersion layer 520 is formed on the interlayer insulation layer 510. The material of the electrostatic charge dispersion layer 520 is indium tin oxide or indium zinc oxide, wherein such materials have a high electrical conductivity and have no any influence upon transmittance. The electrostatic charge dispersion layer 520 can achieve a function of electrostatic protection on the source-drain metal layer 507 and the semiconductor layer 503 below the electrostatic charge dispersion layer 520 after the electrostatic charge dispersion layer 520 is formed until the second transparent electrode layer 511 is formed. Moreover the film thickness d of the electrostatic charge dispersion layer 520 ranges from 5 nm to 500 nm, so that better electrostatic protection can be achieved while the cost is controlled and a lower resistivity is maintained. Moreover the electrostatic charge dispersion layer 520 and the interlayer insulation layer 510 are provided with the via holes 533 at the connection section 509a of the first transparent electrode layer 509 in the display area Pa.

The second transparent electrode layer 511, i.e., the second film layer as referred to in the present embodiment, is formed on the electrostatic charge dispersion layer 520. In the display area Pa, the second transparent electrode layer 511 is electrically connected with the connection section 509a of the first transparent electrode layer 509 through the via holes 533 of the interlayer insulation layer 510 and the electrostatic charge dispersion layer 520. Moreover the electrostatic charge dispersion layer 520 is in the same profile as the second transparent electrode layer 511. The profiles of the electrostatic charge dispersion layer 520 and the second transparent electrode layer 511 can be formed in the same process step in the preparation process without any addition process step.

Figure 14:
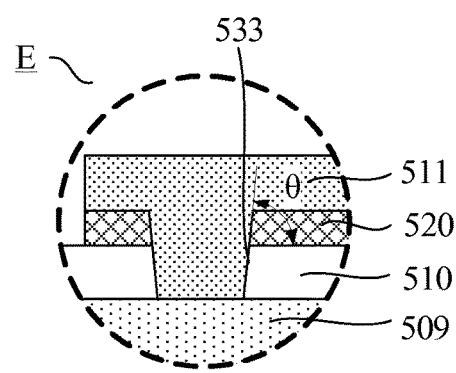
FIG. 14 illustrates a schematic enlarged diagram of the region E in FIG. 13.

More particularly, FIG. 14 illustrates a schematic enlarged diagram of the region E in FIG. 13. Referring to FIG. 13 and FIG. 14, the interlayer insulation layer 510, the electrostatic charge dispersion layer 520 and the second transparent electrode layer 511 are formed in order on the first transparent electrode layer 509. The electrostatic charge dispersion layer 520 and the interlayer insulation layer 510 are provided with the via holes 533. The electrostatic charge dispersion layer 520 is inclined at the via holes 533 at an angle $\theta$ ranging from 0° to 90° and preferably 30° to 60°. Due to the inclination angle of the electrostatic charge dispersion layer here, electrostatic charges accumulated on the substrate can be more easily discharged on the electrostatic charge dispersion layer 520 through surface leakage, etc., to thereby achieve a better electrostatic protection effect.

The array substrate according to the present embodiment includes the electrostatic charge dispersion layer, so that accumulation of electrostatic charges on the array substrate in the fabrication process of the substrate can be lowered. The connection section of the first transparent electrode layer and the source-drain metal layer are electrically connected with the semiconductor layer in the display area so that the charges accumulated on the semiconductor layer and the source-drain metal layer can be released onto the surface of the electrostatic charge dispersion layer through surface leakage, to thereby lower a damage of the electrostatic charges to the semiconductor layer thus improving the stability and the uniformity of the TFT devices, avoiding the TFT devices from being struck or damaged by the electrostatic charges to consequentially come with electrical drifting, and eliminating various electrostatic Muras. Moreover the electrostatic charge dispersion layer directly contacts with the second transparent electrode layer so that the resistivity of the second transparent electrode layer can be lowered to thereby improve a display quality.

FIG. 15 illustrates schematic structural diagrams of a flow of fabricating the array substrate in FIG. 13 in sectional views.

Referring to FIG. 15, the step is performed: preparing a substrate and forming a first film layer on one side surface of the substrate.

Figure 15A:
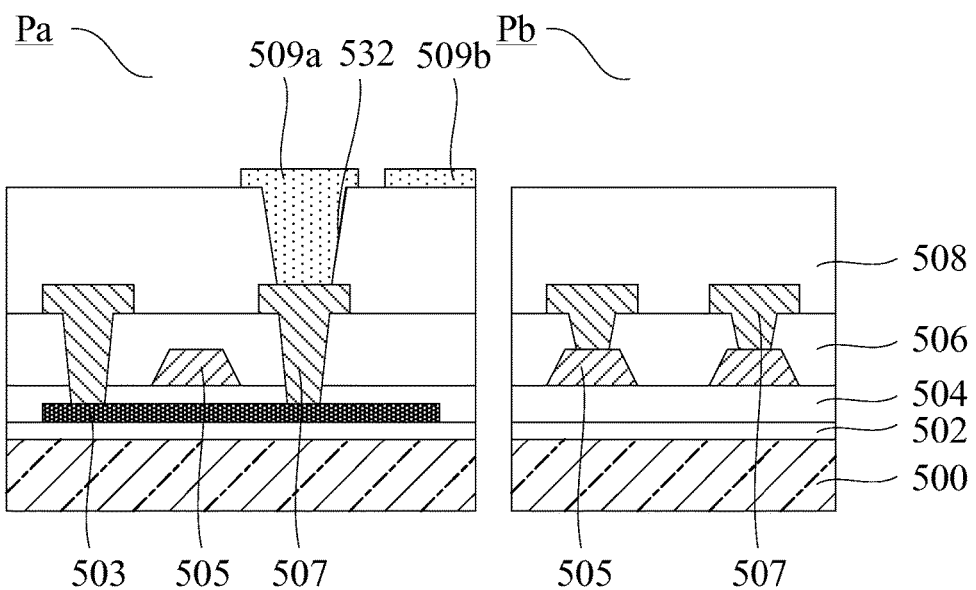
FIGS. 15a-15f illustrate schematic structural diagrams of a flow of fabricating the array substrate in FIG. 13 in sectional views.

Particularly, referring to FIG. 15a, this step includes: forming the first transparent electrode layer 509 on the substrate 500 and patterning the first transparent electrode layer 509. The first transparent electrode layer 509 is the first film layer as referred to in the present embodiment.

More particularly, the step of forming the first film layer on one side surface of the substrate in the present embodiment includes: preparing the substrate 500; forming the buffer layer 502 on the substrate 500; forming the semiconductor layer 503 on the buffer layer 502 and patterning the semiconductor layer 503; forming the gate insulation layer 504 on the semiconductor layer 503; forming the gate metal layer 505 on the gate insulation layer 504 and patterning the gate metal layer 505; forming the interlayer dielectric layer 506 on the gate metal layer 505 and forming the via holes; forming the source-drain metal layer 507 on the interlayer dielectric layer 506 and patterning the source-drain metal layer 507; forming the passivation layer 508 on the source-drain metal layer 507 and patterning the passivation layer 508; and forming the first transparent electrode layer 509 on the passivation layer 508 and patterning the first transparent electrode layer.

Referring to FIG. 15*a* together with FIG. 9*a*, the steps, before the passivation layer 508 is formed and patterned, in the steps of forming the first film layer in the present embodiment are the same as in the steps of forming the first film layer in the other embodiment of the invention, and reference can be made to the step of forming the first film layer in the other embodiment of the invention for details thereof, so a repeated description thereof will be omitted here.

Those differences from the steps of forming the first film layer in the other embodiment of the invention will be focused upon. After the source-drain metal layer 507 is formed, the passivation layer 508 is formed on the source-drain metal layer 507 and patterned. The passivation layer 508 can be a monolayer of an organic passivation layer or an inorganic passivation layer or can be a multilayer of a silicon nitride film/silicon oxide film and an organic passivation layer film/inorganic passivation layer film. The passivation layer 508 is formed by plasma enhanced chemical vapor deposition. The passivation layer 508 is patterned by forming the via holes 532 in the passivation layer at the locations corresponding to drain areas formed by the source-drain metal layer 507. The step of forming the via holes 532 includes: forming a photoresist layer on the surface of the passivation layer 508; patterning the photoresist layer, particularly by exposure and development processes; etching the passivation layer 508 to form the predetermined via holes; and removing the remaining photoresist layer.

The first transparent electrode layer 509 is formed on the passivation layer 508 and patterned. The first transparent electrode layer 509 is formed on the passivation layer 508 by physical deposition, so that the first transparent electrode layer 509 covers the entire surface of the substrate 500, particularly by forming the first transparent electrode layer by sputtering, i.e., bombarding a target to transfer the film material from the target onto the substrate. The step of patterning the first transparent electrode layer 509 includes: forming a photoresist layer on the surface of the first transparent electrode layer 509; patterning the photoresist layer, particularly by exposure and development processes; etching the first transparent electrode layer 509 to form a predetermined pattern; and removing the remaining photoresist layer. With the patterning process, the first transparent electrode layer 509 is formed as the connection section 509*a* which is electrically connected with the source-drain metal layer 507 through the via holes 532 of the passivation layer 508 described above, and the electrode section 509*b* separated from the connection section.

Further referring to FIG. 15, the step is performed: forming an insulation layer on the first film layer so that the insulation layer covers the first film layer and the substrate.

Figure 15B:
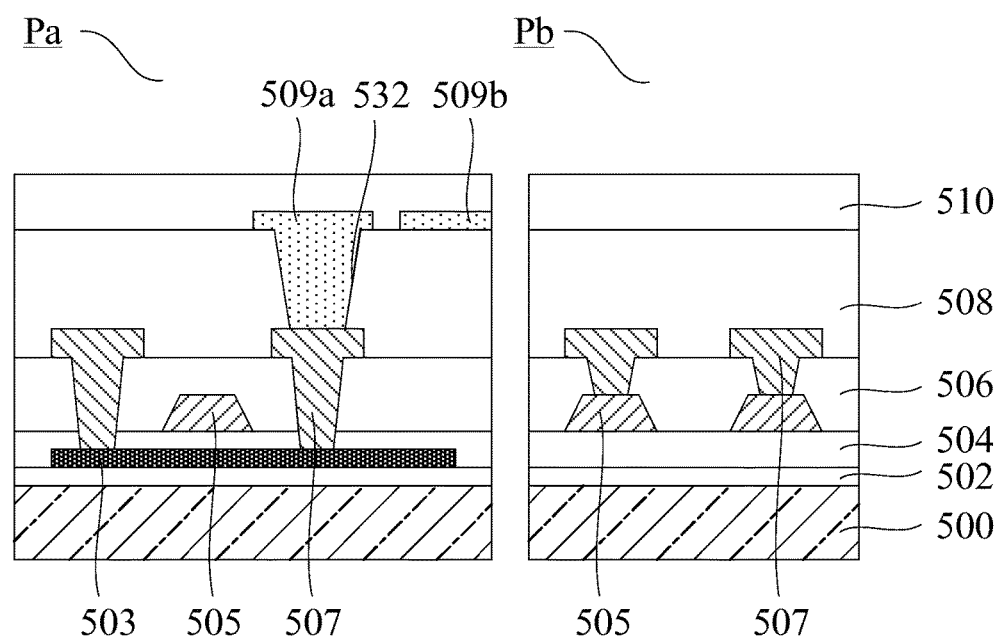

Particularly, referring to FIG. 15*b*, the step includes: forming the interlayer insulation layer 510 on the first transparent electrode layer 509. The interlayer insulation layer 510 is the insulation layer as referred to in the present embodiment.

The interlayer insulation layer 510 is formed on the first transparent electrode layer 509. The interlayer insulation layer 510 can be a monolayer of an organic passivation layer or an inorganic passivation layer or can be a multilayer of a silicon nitride/silicon oxide film and an organic passivation layer film/inorganic passivation layer film. The interlayer insulation layer 510 is formed by plasma enhanced chemical vapor deposition.

Further referring to FIG. 15, the step is performed: forming an electrostatic charge dispersion layer on the insulation layer.

Figure 15C:
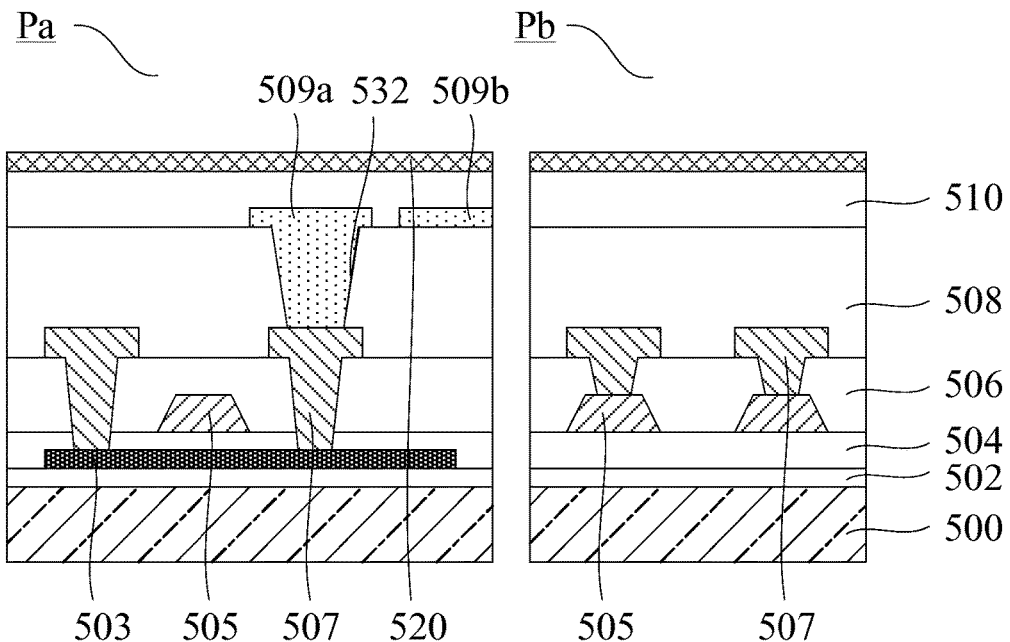

As illustrated in FIG. 15*c*, the step includes: forming the electrostatic charge dispersion layer 520 on the interlayer insulation layer 510 so that the electrostatic charge dispersion layer 520 covers the entire surface of the substrate 500. The electrostatic charge dispersion layer 520 is formed by physical deposition, particularly by sputtering, i.e., bombarding a target to transfer the film material from the target onto the substrate. The material of the electrostatic charge dispersion layer 520 is indium tin oxide or indium zinc oxide, wherein such materials have a high electrical conductivity and have no any influence upon transmittance. In a subsequent process, the electrostatic charge dispersion layer 520 can achieve a function of electrostatic protection on the metal layer and the semiconductor layer below the electrostatic charge dispersion layer 520. In the present embodiment, the electrostatic charge dispersion layer 520 is made of indium tin oxide. The film thickness d of the electrostatic charge dispersion layer 520 ranges from 5 nm to 500 nm, so that better electrostatic protection can be achieved while the cost is controlled and a lower resistivity is maintained.

Further referring to FIG. 15, the step is performed: forming via holes in the insulation layer and the electrostatic charge dispersion layer so that the electrostatic charge dispersion layer covers the insulation layer other than the area of the via holes.

Figure 15D:
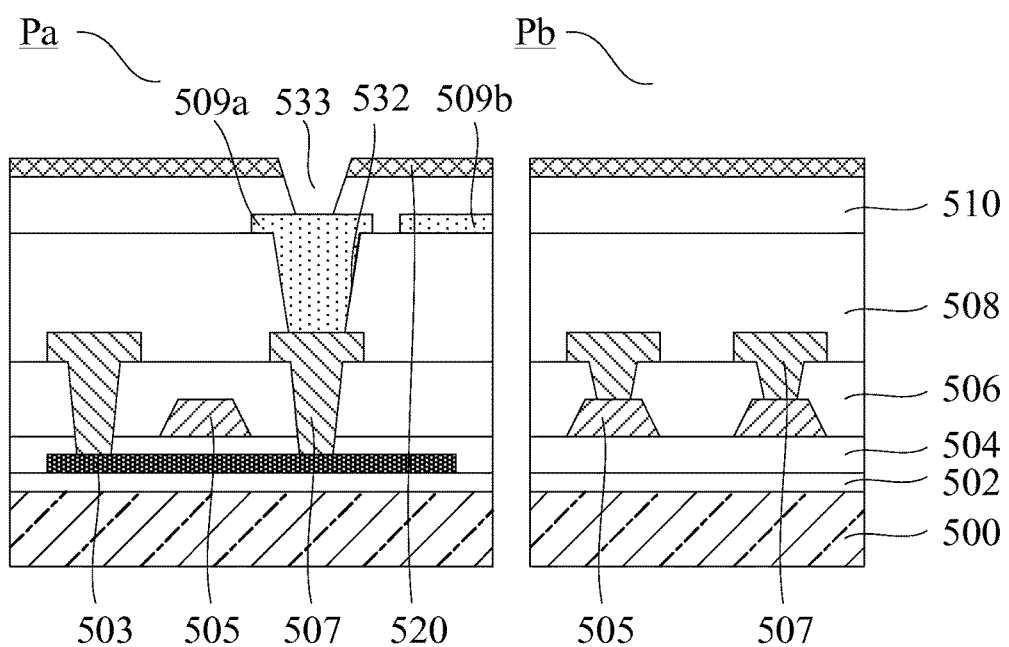

As illustrated in FIG. 15*d*, in the display area Pa, the via holes 533 are formed in the electrostatic charge dispersion layer 520 and the interlayer insulation layer 510 at the connection section 509*a* of the first transparent electrode layer 509 so that the electrostatic charge dispersion layer 520 covers the interlayer insulation layer 510 other than the area of the via holes; and no via holes are formed in the peripheral area Pb.

Particularly the forming the via holes 533 in the electrostatic charge dispersion layer 520 and the insulation layer, i.e., the interlayer insulation layer 510, includes: forming a photoresist layer on the surface of the electrostatic charge dispersion layer 520; patterning the photoresist layer, particularly by exposure and development processes, where in the exposure process, the photoresist layer is irradiated with UV-rays using a mask in a predetermined pattern, and in the development process, the photoresist pattern of the irradiated part is removed using alkaline developing solution after the exposure process to thereby form the photoresist pattern in the predetermined pattern; etching the electrostatic charge dispersion layer 520 and the insulation layer, i.e., the interlayer insulation layer 510, to form the electrostatic charge dispersion layer 520 and the insulation layer, i.e., the interlayer insulation layer 510 with the via holes; and removing the remaining photoresist layer.

More particularly the etching the electrostatic charge dispersion layer 520 and the interlayer insulation layer 510 includes: etching the electrostatic charge dispersion layer 520 so that the electrostatic charge dispersion layer 520 is inclined at the edges of the via holes 533 at an angle θ (not illustrated) ranging from 0° to 90° and preferably 30° to 60°; and etching the interlayer insulation layer 510.

Cleaning and drying can be further performed after the photoresist is stripped to remove impurities on the surface of the substrate 500.

The substrate may be susceptible to electrostatic charges in the course of forming the via holes 533, in the course of stripping the photoresist and cleaning and drying after the via holes 533 are formed, and in the course of transporting the substrate. The electrostatic charges primarily arise from the following three aspects: frictional electrification including friction with the air, friction of the glass substrate with a brush and friction of the glass substrate with a base during transportation, washing friction with pure water during cleaning, friction of an air blade with the air, etc.; contact and separation electrification including separation of the glass substrate after coming into contact with the base, plasmas bombard, ion bombard, contact with agent liquid; and inductive electrification, e.g., electrostatic charges inductively generated in proximity to a charged object. The electrostatic charges may be easily released after being accumulated to some extent. Since the surface of the substrate is covered with the electrostatic charge dispersion layer 520 throughout the formation of the via holes, the electrostatic charges accumulated on the semiconductor layer 503 and the source-drain metal layer 507 can be released through their connection with each other onto the surface of the connection section 509a of the first transparent electrode layer 509 and then released onto the surface of the electrostatic charge dispersion layer 520 through surface leakage over the high resistance of the air or otherwise without incurring any electrostatic damage to the semiconductor layer 503 and the source-drain metal layer 507.

Further referring to FIG. 15, the step is performed: forming a second film layer on the electrostatic charge dispersion layer, wherein the second film layer is electrically connected with the first film layer through the via holes.

Figure 15E:
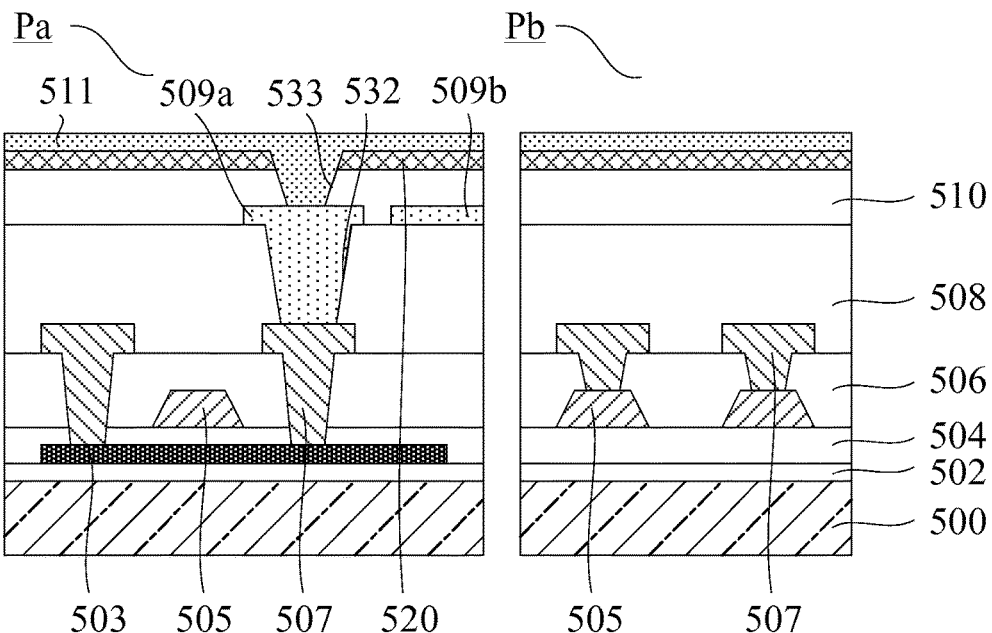

As illustrated in FIG. 15e, the second transparent electrode layer 511 is formed on the electrostatic charge dispersion layer 520 so that the second transparent electrode layer 511 covers the entire surface of the substrate 500. The second transparent electrode layer 511 is electrically connected with the connection section 509a of the first transparent electrode layer 509 through the via holes 533 formed in the step descried above in the display area Pa. The second film layer as referred to in the present embodiment is the second transparent electrode layer 511. The second transparent electrode layer 511 is formed by physical deposition, particularly by sputtering, i.e., bombarding a target to transfer the film material from the target onto the substrate.

Further referring to FIG. 15, the step is performed: patterning the second film layer and the electrostatic charge dispersion layer so that the electrostatic charge dispersion layer is in the same profile as the second film layer.

Figure 15F:
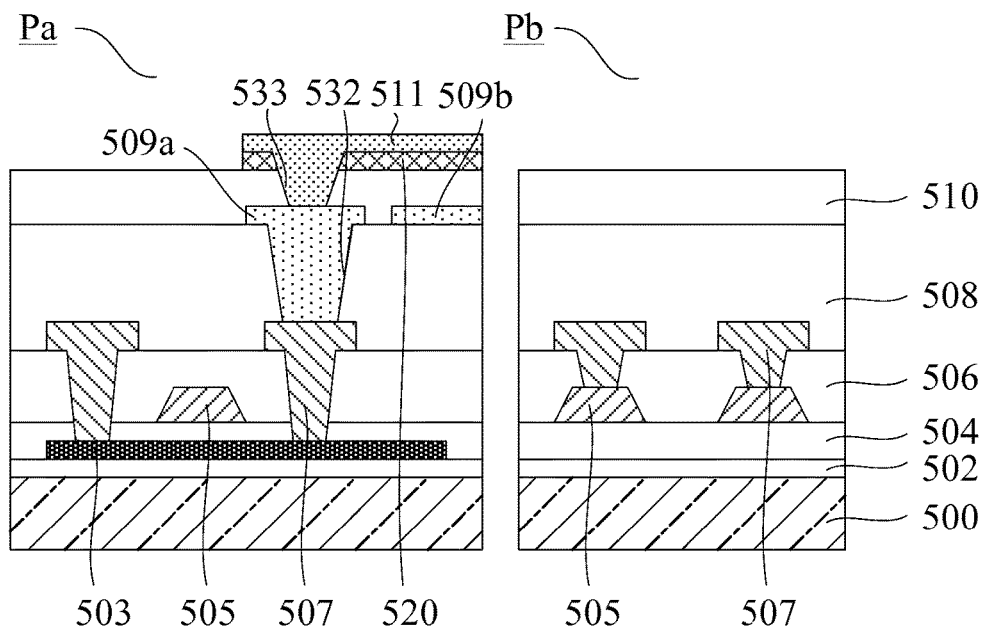

As illustrated in FIG. 15f, the second transparent electrode layer 511 and the electrostatic charge dispersion layer 520 are patterned so that the electrostatic charge dispersion layer 520 is in the same profile as the second transparent electrode layer 511.

Particularly a photoresist layer is formed on the surface of the second film layer, i.e., the second transparent electrode layer 511; the photoresist layer is patterned, the patterning process is the same as the process in which the photoresist is patterned in the step descried above, so a repeated description thereof will be omitted here; the second film layer, i.e., the second transparent electrode layer 511, and the electrostatic charge dispersion layer 520 are etched so that the electrostatic charge dispersion layer 520 is in the same profile as the second transparent electrode layer 511; and the remaining photoresist layer is removed. Since both the second transparent electrode layer 511 and the electrostatic charge dispersion layer 520 are transparent conducting oxide materials, the second transparent electrode layer 511 and the electrostatic charge dispersion layer 520 can be etched in the same process step. With wet etching, the materials of the second transparent electrode layer 511 and electrostatic charge dispersion layer 520 in the areas uncovered by the photoresist chemically react with etching liquid on the surfaces of the materials and the materials are consumed gradually as the chemical reaction proceeds constantly until all the second transparent electrode material and the electrostatic charge dispersion layer material in the areas uncovered by the photoresist are consumed, so that the second transparent electrode layer 511 is in the same profile as the electrostatic charge dispersion layer 520.

In the method of fabricating an array substrate according to the present embodiment, the electrostatic charge dispersion layer is formed in the fabrication process so that accumulation of electrostatic charges on the array substrate in the fabrication process of the substrate can be lowered. The connection section of the first transparent electrode layer, the source-drain metal layer and the semiconductor layer are electrically connected through the via holes in the display area, so that the charges accumulated on the semiconductor layer and the source-drain metal layer can be released onto the surface of the connection section of the first transparent electrode layer and further released onto the surface of the electrostatic charge dispersion layer through surface leakage to thereby lower a damage of the electrostatic charges to the semiconductor layer thus improving the stability and the uniformity of the TFT devices, avoiding the TFT devices from being struck or damaged by the electrostatic charges to consequentially come with electrical drifting, and eliminating various electrostatic Muras. Moreover the electrostatic charge dispersion layer directly contacts with the second transparent electrode layer so that the resistivity of the second transparent electrode layer can be lowered to thereby improve delay attenuation of a display signal over the second transparent electrode layer thus enhancing a display quality. Moreover the electrostatic charge dispersion layer can be patterned using the same mask as the source-drain metal layer without any addition process step.

Figure 16:
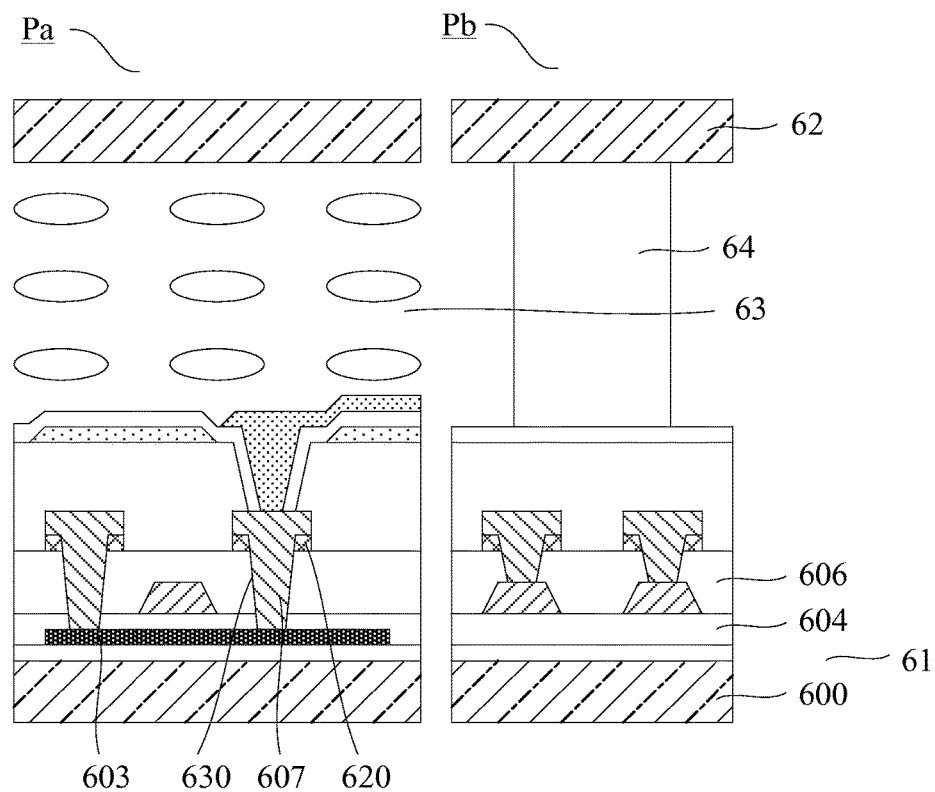
FIG. 16 illustrates a schematic structural diagram of a liquid crystal display panel according to an embodiment of the present invention in a sectional view.

FIG. 16 illustrates a schematic structural diagram of a liquid crystal display panel according to an embodiment of the invention in a sectional view.

Referring to FIG. 16, the liquid crystal display panel includes an array substrate 61, an opposite substrate 62, and a liquid crystal layer 63 interposed between the array substrate 61 and the opposite substrate 62.

Particularly the liquid crystal display panel includes a display area Pa and a peripheral area Pb, where the array substrate 61 and the opposite substrate 62 are connected by seal 64 in the peripheral area Pb.

More particularly the array substrate 61 includes: a substrate 600, and a first film layer, an insulation layer, an electrostatic charge dispersion layer and a second film layer arranged in order on one side surface of the substrate, where the insulation layer and the electrostatic charge dispersion layer are provided with via holes, and the second film layer is electrically connected with the first film layer through the via holes; and the electrostatic charge dispersion layer is in the same profile as the second film layer.

In the present embodiment, a semiconductor layer 603, a gate insulation layer 604, an interlayer dielectric layer 606, an electrostatic charge dispersion layer 620 and a source-drain metal layer 607 are formed in order on the substrate 600. The semiconductor layer 603 is the first film layer as referred to in the present embodiment, the gate insulation layer 604 and the interlayer dielectric layer 606 are the insulation layer as referred to in the present embodiment, the source-drain metal layer 607 is the second film layer as referred to in the present embodiment, and the source-drain metal layer 607 is electrically connected with a gate metal layer 605 through via holes 630 of the electrostatic charge dispersion layer 620 and the interlayer dielectric layer 606. Moreover the electrostatic charge dispersion layer 620 is in the same profile as the source-drain metal layer 607.

The array substrate of the liquid crystal display panel according to the present embodiment includes the electrostatic charge dispersion layer so that accumulation of electrostatic charges on the array substrate in the fabrication process of the substrate can be lowered and a damage of the electrostatic charges to the semiconductor layer can be lowered in the display area to thereby improve the stability and the uniformity of the TFT devices, avoid the TFT devices from being struck or damaged by the electrostatic charges to consequentially come with electrical drifting, and eliminate various electrostatic Muras. A poor display effect due to layer erosion, etc., in the peripheral area arising from discharging of the electrostatic charges can be improved to thereby improve a product yield. Moreover the electrostatic charge dispersion layer directly contacts with the source-drain metal layer so that the resistivity of the source-drain metal layer can be lowered to thereby improve delay attenuation of a display signal over a wire consisted of the source-drain metal layer thus enhancing a display quality.

The invention has been further described above in details with reference to the particular preferred embodiments thereof, and it shall not be deemed that particular implementations of the invention will be limited thereto. Those ordinarily skilled in the invention can further make several apparent derivations or substitutions thereto without departing from the spirit of the invention, and all the derivations or substitutions shall be deemed as falling into the scope of the invention.

What is claimed:

1. An array substrate, comprising:
    a substrate;
    a first film layer on the substrate;
    an insulation layer on the first film layer;
    an electrostatic charge dispersion layer on the insulation layer, via holes formed in the insulation layer and the electrostatic charge dispersion layer; and
    a second film layer arranged on the electrostatic charge dispersion layer, wherein:
    the second film layer is electrically and directly connected with the first film layer by passing through the via holes, and
    the electrostatic charge dispersion layer is in a same profile as the second film layer.

2. The array substrate according to claim 1, wherein the electrostatic charge dispersion layer is inclined at edges of the via holes at an angle θ between about 30° and 60°.

3. The array substrate according to claim 1, wherein a semiconductor layer, a gate insulation layer, a gate metal layer, an interlayer dielectric layer, and a source-drain metal layer are sequentially arranged on the substrate, wherein the first film layer is the semiconductor layer, the insulation layer is the gate insulation layer and/or the interlayer dielectric layer, and the second film layer is the source-drain metal layer.

4. The array substrate according to claim 3, wherein the electrostatic charge dispersion layer comprises at least one of molybdenum, titanium, iron, zinc, aluminum and magnesium.

5. The array substrate according to claim 1, wherein a gate metal layer, a gate insulation layer and a source-drain metal layer are sequentially arranged on the substrate, wherein the first film layer is the gate metal layer, the insulation layer is the gate insulation layer, and the second film layer is the source-drain metal layer.

6. The array substrate according to claim 5, wherein the electrostatic charge dispersion layer comprises at least one of molybdenum, titanium, iron, zinc, aluminum and magnesium.

7. The array substrate according to claim 1, wherein a source-drain metal layer, a passivation layer and a first transparent electrode layer are sequentially arranged on the substrate, wherein the first film layer is the source-drain metal layer, the insulation layer is the passivation layer, and the second film layer is the first transparent electrode layer.

8. The array substrate according to claim 7, wherein the electrostatic charge dispersion layer comprises at least one of indium tin oxide and indium zinc oxide.

9. The array substrate according to claim 1, wherein a source-drain metal layer, a passivation layer, a first transparent electrode layer, an interlayer insulation layer and a second transparent electrode layer are sequentially arranged on the substrate, wherein the first film layer is the source-drain metal layer, the insulation layer is the interlayer insulation layer, and the second film layer is the second transparent electrode layer.

10. The array substrate according to claim 9, wherein the electrostatic charge dispersion layer comprises at least one of indium tin oxide and indium zinc oxide.

11. The array substrate according to claim 1, wherein a first transparent electrode layer, an interlayer insulation layer and a second transparent electrode layer are sequentially arranged on the substrate, wherein the first film layer is the first transparent electrode layer, the insulation layer is the interlayer insulation layer, and the second film layer is the second transparent electrode layer.

12. The array substrate according to claim 11, wherein the electrostatic charge dispersion layer comprises at least one of indium tin oxide and indium zinc oxide.

13. The array substrate according to claim 1, wherein a film thickness d of the electrostatic charge dispersion layer is between about 5 nm and 500 nm.

14. A liquid crystal display panel, comprising an opposite substrate, an array substrate, and a liquid crystal layer interposed between the array substrate and the opposite substrate, wherein the array substrate comprising:
    a substrate,
    a first film layer on the substrate,
    an insulation layer on the first film layer,
    an electrostatic charge dispersion layer on the insulation layer, via holes formed in the insulation layer and the electrostatic charge layer, and
    a second film layer arranged on the electrostatic charge dispersion layer, wherein:
    the second film layer is electrically and directly connected with the first film layer by passing through the via holes, and
    the electrostatic charge dispersion layer is in a same profile as the second film layer.

\* \* \* \* \*